(12) United States Patent
Herner

(10) Patent No.: US 10,727,210 B2
(45) Date of Patent: Jul. 28, 2020

(54) LIGHT EMITTING DEVICE WITH SMALL SIZE AND LARGE DENSITY

(71) Applicant: Scott Brad Herner, Portland, OR (US)

(72) Inventor: Scott Brad Herner, Portland, OR (US)

(73) Assignee: Black Peak, LLC, Boulder, CO (US)

( * ) Notice: Subject to any disclaimer, the term of this patent is extended or adjusted under 35 U.S.C. 154(b) by 0 days.

(21) Appl. No.: 16/726,445

(22) Filed: Dec. 24, 2019

(65) Prior Publication Data

US 2020/0135704 A1 Apr. 30, 2020

Related U.S. Application Data

(63) Continuation of application No. 15/984,370, filed on May 20, 2018, now Pat. No. 10,566,317.

(51) Int. Cl.
| | |
|---|---|
| H01L 25/075 | (2006.01) |
| H01L 23/48 | (2006.01) |
| H01L 33/30 | (2010.01) |
| H01L 33/32 | (2010.01) |
| H01L 33/50 | (2010.01) |
| H01L 33/60 | (2010.01) |
| H01L 33/62 | (2010.01) |
| H01L 21/768 | (2006.01) |
| H01L 21/8234 | (2006.01) |
| H01L 27/088 | (2006.01) |
| H01L 29/45 | (2006.01) |
| H01L 33/22 | (2010.01) |
| H01L 33/42 | (2010.01) |
| H01L 21/285 | (2006.01) |

(52) U.S. Cl.
CPC .... *H01L 25/0753* (2013.01); *H01L 21/28518* (2013.01); *H01L 21/76898* (2013.01); *H01L 21/823475* (2013.01); *H01L 23/481* (2013.01); *H01L 27/088* (2013.01); *H01L 29/45* (2013.01); *H01L 33/22* (2013.01); *H01L 33/30* (2013.01); *H01L 33/32* (2013.01); *H01L 33/42* (2013.01); *H01L 33/507* (2013.01); *H01L 33/60* (2013.01); *H01L 33/62* (2013.01); *H01L 2933/0041* (2013.01); *H01L 2933/0058* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 7,692,191 B2* | 4/2010 | Kwak | H01L 51/5218 257/59 |
| 2006/0115231 A1* | 6/2006 | Ishida | H01L 51/5203 385/147 |

(Continued)

*Primary Examiner* — Michelle M Mandala
*Assistant Examiner* — Jordan M Klein
(74) *Attorney, Agent, or Firm* — Scott Brad Herner

(57) ABSTRACT

This application describes a light emitting device, an assembly of light emitting devices, a display comprising assemblies of light emitting devices, and methods of fabricating same. The light emitting device comprises a transistor, an LED that at least partially overlies the transistor, a reflector layer disposed between the LED and transistor, and conductive wires that connect electrically the transistor to the LED. The assembly comprises a plurality of light emitting devices, and the display comprises a plurality of assemblies.

13 Claims, 19 Drawing Sheets

(56) References Cited

U.S. PATENT DOCUMENTS

| | | | |
|---|---|---|---|
| 2007/0126353 A1* | 6/2007 | Kubota | H01L 51/5268 |
| | | | 313/506 |
| 2007/0295961 A1* | 12/2007 | Kim | H01L 51/5271 |
| | | | 257/40 |
| 2008/0309232 A1* | 12/2008 | Yamamoto | H01L 51/5265 |
| | | | 313/505 |
| 2009/0322657 A1* | 12/2009 | Na | H01L 27/3246 |
| | | | 345/76 |
| 2010/0025664 A1* | 2/2010 | Park | H01L 27/326 |
| | | | 257/40 |
| 2010/0133998 A1* | 6/2010 | Nishikawa | H01L 51/5268 |
| | | | 313/505 |
| 2014/0299854 A1* | 10/2014 | Mizuno | H01L 51/5271 |
| | | | 257/40 |
| 2015/0206928 A1* | 7/2015 | Kimura | H01L 51/5271 |
| | | | 257/88 |
| 2016/0226030 A1* | 8/2016 | Heo | H01L 51/5284 |
| 2016/0278201 A1* | 9/2016 | Cheon | H01L 27/3297 |
| 2017/0047313 A1* | 2/2017 | Yang | H01L 23/5384 |
| 2017/0092707 A1* | 3/2017 | Wang | H01L 51/5206 |
| 2017/0250318 A1* | 8/2017 | Cha | H01L 33/504 |
| 2017/0271847 A1* | 9/2017 | Tanaka | H01S 5/1231 |
| 2017/0279084 A1* | 9/2017 | Sakamoto | H01L 27/3279 |
| 2017/0358562 A1* | 12/2017 | Banna | H01L 25/0753 |
| 2018/0182931 A1* | 6/2018 | Lee | H01L 25/0753 |
| 2018/0212198 A1* | 7/2018 | Inoue | H01L 51/5271 |

* cited by examiner

LIGHT EMITTING DEVICE WITH SMALL SIZE AND LARGE DENSITY

RELATED APPLICATIONS

This is a continuation application of U.S. patent application Ser. No. 15/984,370 filed May 20, 2018, which is assigned to the assignee hereof and filed by the inventor hereof and which is incorporated by reference herein.

FIELD

The embodiments of the invention are directed generally to light emitting devices, and specifically to those with small size, large density per unit area, and less expensive manufacture.

BACKGROUND

Light emitting diodes (LEDs) are the illuminating source for many kinds of displays. Singulated LEDs are often connected to a transistor, and assemblies of LEDs and transistors can form displays. The current manufacturing steps to assemble singulated LEDs with transistors do not allow for small size and large density per unit area. In addition, the cost for conventional light emitting device manufacturing steps are high. It is advantageous to increase the density and reduce the cost of light emitting devices.

SUMMARY

Embodiments described herein provide for a light emitting device with large density and manufacturing steps that are lower cost than conventional methods. A specific embodiment is for a transistor substrate having a top surface, the top surface having a plurality of conductive regions. The conductive regions may further comprise silicide layers. There is a plurality of conductive wires, wherein each conductive wire of the plurality extends from a conductive region. A transistor is formed in the top surface of the transistor substrate. An LED having a surface area at least partially overlies the transistor. There is a reflector layer disposed between the transistor and the LED.

In another embodiment, a light emitting assembly has a transistor substrate having a top surface with a plurality of conductive regions. There is a plurality of conductive wires, with each conductive wire extending from a conductive region. There is a plurality of transistors formed in the top surface of the transistor substrate, and a plurality of LEDs, with each LED having a surface area and each LED at least partially overlying at least one transistor of the plurality. There is at least one reflector layer, and the reflector layer is disposed between one transistor and one LED.

In another embodiment, a display apparatus has a plurality of light emitting assemblies, and a backboard. Each assembly of the plurality has a transistor substrate having a top surface, the top surface having a plurality of conductive regions. Each assembly has a plurality of conductive wires, each conductive wire extending from to a conductive region. Each assembly of the plurality has a plurality of transistors, with each transistor formed in the top surface of the transistor substrate. Each assembly has a plurality of LEDs with each LED having a surface area. Each LED is connected electrically to a transistor. Each assembly has a plurality of reflector layers, wherein at least one reflector layer is disposed between one LED and a transistor. The backboard has a plurality of metal interconnects, and at least one metal interconnect is connected electrically to at least one of the transistors.

In another embodiment, a method of forming an assembly of light emitting devices comprises providing a transistor substrate having a top surface, the top surface comprising a plurality of conductive regions. A plurality of transistors is formed in the top surface of the transistor substrate. An LED substrate is provided, and a plurality of LEDs is formed on the LED substrate. Each LED has a surface area. At least one reflector layer is formed and the reflector layer at least partially overlies an LED of the plurality. The plurality of LEDs is bonded to the plurality of transistors, wherein after the bonding, each reflector layer of the plurality is disposed between an LED and a transistor, each LED is connected electrically to a transistor, and each LED at least partially overlies a transistor.

In another embodiment, a method of forming a display apparatus is provided. The method comprises forming a plurality of light assemblies. Each light assembly is formed by providing a transistor substrate having a top surface, the top surface comprising a plurality of conductive regions. A plurality of transistors is formed in the top surface of the transistor substrate. An LED substrate is provided, and a plurality of LEDs is formed on the LED substrate. Each LED has a surface area. A plurality of reflector layers is formed, each reflector layer at least partially overlying an LED of the plurality. The plurality of LEDs is bonded to the plurality of transistors, wherein after the bonding, each reflector layer of the plurality is disposed between an LED and a transistor, each LED is connected electrically to a transistor, and each LED at least partially overlies a transistor. After forming the plurality of light assemblies, a backboard is provided, wherein the backboard comprises a plurality of metal interconnects. The assemblies are bonded to the backboard, wherein after bonding, each metal interconnect is electrically connected to a transistor of the plurality of transistors.

These and other aspects and advantages of the embodiments described herein will become apparent from the following detailed description and the accompanying drawings, which illustrate by way of example the features of the respective embodiments. One skilled in the art would recognize other variations, modifications, and alternatives.

BRIEF DESCRIPTION OF THE DRAWINGS

The drawings are not to scale, and the thickness of some layers may be exaggerated for clarity. These and other features, aspects, and advantages of the embodiments described herein will become better understood with regard to the following description, appended claims, and accompanying drawings, where:

DETAILED DESCRIPTION OF THE DISCLOSURE

Figure 1A:
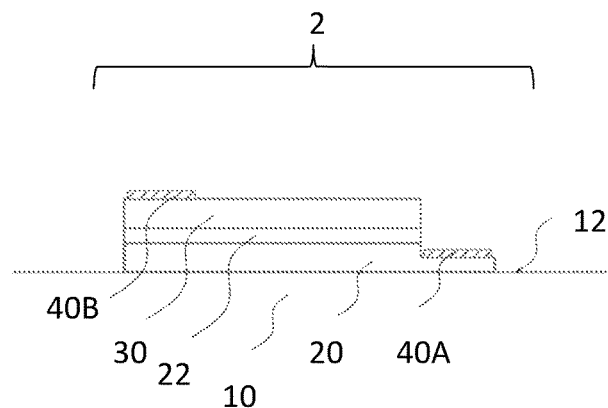
FIG. 1A schematically illustrates a cross sectional view of an LED.

Some embodiments of light emitting devices described herein comprise an LED, a transistor, elements to connect these devices to a backboard, and other associated elements. In the embodiments described herein, singulation of LEDs is avoided entirely. Singulation describes the separation of one LED die from a group fabricated on a substrate such as a semiconductor wafer. Conventional methods of singulation include sawing the substrate, which results in kerf loss where the sawing blade traveled through the substrate. The kerf can be as much as 100 microns wide. Kerf loss during LED singulation is minimized or even eliminated in the embodiments described herein. Instead of singulation, groups of light emitting devices are diced, which reduces total kerf loss, and allows smaller light emitting devices with smaller pitch to be manufactured. The pitch is the length of one edge of one light emitting device plus the linear space between two adjacent light emitting devices. The LED and associated elements shall be referred to as an LED apparatus. The transistor and associated elements shall be referred to as a transistor apparatus. In one embodiment, a wafer with multiple LED apparatus is bonded to a wafer with multiple transistor apparatus. The wafers with combined LED+transistor apparatus are bonded to a backboard. Displays can be diced from this combination. The size and pitch of the light emitting device is reduced compared to conventional methods by placing the transistor underneath the LED, instead of alongside the LED, as in conventional light emitting devices. The transistor controls the current to the LED to which it is connected. Embodiments of the present invention will first be discussed as a single light emitting device, then as a plurality of light emitting devices, and finally as a display.

Whole wafer process integration is used extensively in embodiments of the present invention. While the substrates for the LED and transistor will sometimes be referred to as wafers, it is to be understood that any appropriate substrate can be used, including those that are not wafers. By completing many fabrication steps on many devices simultaneously, costs are reduced in the present invention. A larger density of LEDs per area is enabled by reducing the size of the LED, and by reducing the distance between adjacent LEDs, resulting in a smaller pitch in the present invention. A plurality of LEDs and associated elements, such as reflector layers, side reflectors, and portions of interconnects, are fabricated on a substrate using standard semiconductor fabrication techniques. A plurality of transistors and associated elements, such as conductive wiring and portions of interconnects, are fabricated on a separate substrate using standard semiconductor fabrication techniques. By fabricating the two apparatus separately, fabrication techniques can be optimized for each.

The LED apparatus and transistor apparatus are bonded together connecting one LED with one transistor. Wafer bonding techniques with low-cost and high-alignment accuracy are routine in semiconductor devices. Further fabrication occurs on the bonded LED+transistor apparatus. The LED+transistor apparatus then undergoes a second bonding step to a backboard, and further fabrication occurs. The completed light emitting device(s) can be used as part of a display. However, it should be recognized that embodiments described herein can have a broad range of applications. Aspects of the light emitting device and methods to form embodiments of the light emitting device are provided.

When reference is made herein to a method comprising two or more defined steps, the defined steps can be carried out in any order or simultaneously (except where context or specific instruction excludes that possibility), and the method can include one or more other steps carried out before any of the defined steps, between two of the defined steps, or after all the defined steps (except where context excludes that possibility).

Light Emitting Device

The fabrication of one embodiment of a single light emitting device will be discussed in section I. The LED apparatus and fabrication will be described in subsection IA, followed by a description of the transistor apparatus and fabrication in subsection IB. These two apparatus will then be joined by a bonding process to form an LED+transistor apparatus, as described in subsection IC. Next, conductive wiring extending from conductive regions of the transistor substrate and fabrication methods will be described in subsection ID. The bonding of the LED+transistor apparatus to the backboard will be discussed in subsection IE. Finally, the formation of wavelength-converting layers will be described in section IF. A light emitting assembly comprising multiple light emitting devices and fabrication will be discussed in section II. Finally, a display comprising a plurality of light emitting assemblies and fabrication will be described in section III.

I. Single Light Emitting Device
A. LED Apparatus

One embodiment of the fabrication of the LED apparatus is described. It is to be understood that fabrication of many LED apparatus is occurring simultaneously. Referring to FIG. 1A, an LED is formed and is shown schematically in cross section. The LED 2 includes an LED substrate 10, a first conductive layer 20 which is disposed on the surface 12 of LED substrate 10, an active layer 22 disposed on first conductive layer 20, and a second conductive layer 30 disposed on active layer 22. Surface 12 is one surface of LED substrate 10, which has another substantially parallel surface, not shown. An electrode layer 40A is disposed on an exposed portion of conductive layer 20 and another electrode layer 40B is disposed on conductive layer 30. It is to be understood that this can represent one of many LEDs on the LED substrate 10.

First conductive layer 20 and second conductive layer 30 may be any suitable semiconductor layer known to those skilled in the art, including but not limited to GaP, AlGaAs, GaAsP, AlGaP, GaInP, InGaN, SiC, AlGaN, AlN, InN, or InP, most preferably GaN. The first and second conductive layers 20 and 30 may be GaN doped to opposite polarity, for example, n-type and p-type. Active layer 22 may be fabricated of any standard semiconductor materials, for example InGaN, in any formation, for example single quantum well, multiple quantum wells, or double heterostructure. As known to those skilled in the art, in other embodiments, there may be so-called current blocking layers (not shown) above and/or below active layer 22 (i.e. the active layer 22 may be deposited on a current blocking layer, and a current blocking layer may be deposited on active layer 22). The principles and mechanisms of the conductive and active layers are well known to those skilled in the art, and are thus omitted herein. Any suitable method may be used to deposit LED semiconducting materials, including but not limited to metal organic chemical vapor deposition (MOCVD), hydride vapor phase epitaxy, molecular beam epitaxy, most preferably MOCVD.

LED substrate 10 upon which the GaN LEDs such as LED 2 are fabricated is any suitable single crystal semiconductor, although any suitable substrate material may be used, including but not limited to sapphire, SiC, GaN, ZnO, and Si. LED substrate 10 should be made of single crystal material which is substantially crystal lattice matched with the first conductive layer 20. Substantially crystal lattice matched is to mean the mismatch between the two crystal lattices is less than about 25%. For example, GaN and sapphire are substantially crystal lattice matched, with a lattice mismatch of 16%.

Figures 1B, 1C:
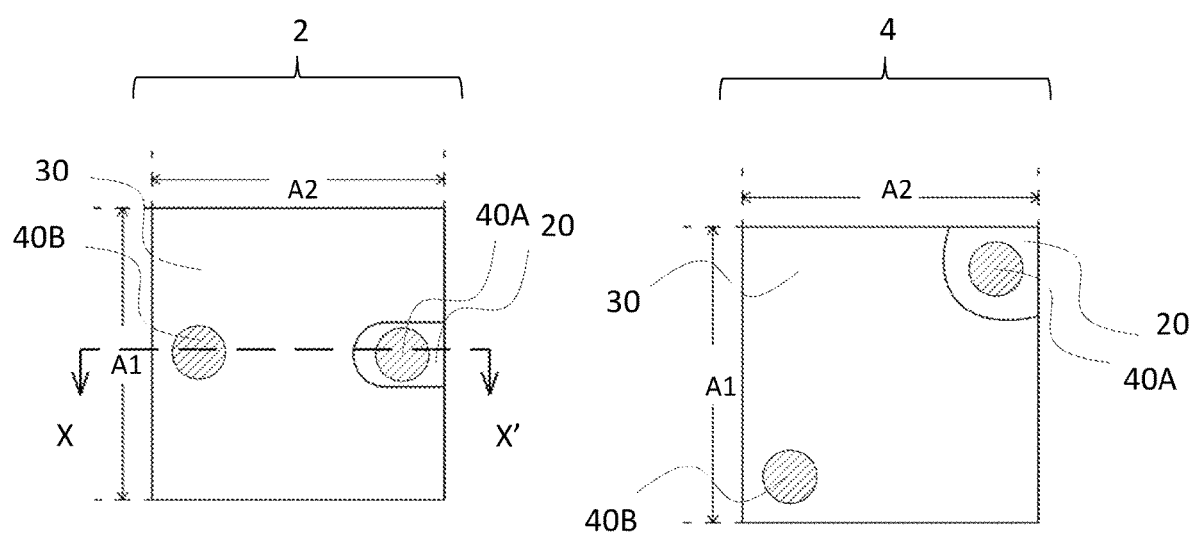
FIGS. 1B and 1C schematically illustrate plan views of an LED with contacts at the middle edges and corners, respectively.

Electrode layers 40A and 40B may be any suitable material to make an ohmic contact to conductive layers 20 and 30, including but not limited to indium tin oxide (ITO), aluminum zinc oxide (AZO), fluorine-doped tin oxide (FTO), aluminum, silver, nickel, or a stack of a nickel layer followed by a gold layer. If electrode layer 40B is a transparent conductive oxide (TCO) such as ITO, AZO, or FTO, it may substantially overlie most or all of second conductive layer 30 instead of only a portion of it, as shown in FIG. 1. Electrode layers 40A and 40B may be deposited by any suitable technique, such as evaporation, CVD, or sputtering, most preferably evaporation. While electrode layers 40A and 40B are shown in plan view in FIGS. 1B and 1C as round, they may have any suitable shape, for example round with current spreading lines emanating from the round shape. In one example, electrode layers 40A and 40B may have a diameter of 1 micron, although any suitable size may be used.

FIGS. 1B and 1C are schematic plan view illustrations of LEDs. FIG. 1B is a plan view of LED 2 shown in cross sectional schematic in FIG. 1A, with LED 2 having electrode layers 40A and 40B in one of the middle edges of conductive layers 20 and 30. In the plan view of FIG. 1B, the cross section X-X' is shown in FIG. 1A. An example of a different placement of electrodes is shown in FIG. 1C. FIG. 1C is a plan view schematic of a different LED 4, with electrode layers 40A and 40B in one corner of each of the conductive layers. While FIGS. 1B and 1C both show square-shaped LEDs in plan view, the LEDs may take any suitable shape in plan view, such as rectangular, triangular, or any other polygon. In the present invention, dimensions A1 and A2 may be 200 microns, 10 microns, 5 microns, or even smaller values. The surface area of LED 2 or LED 4 is the largest area of the first conductive layer 20. As shown in FIGS. 1A, 1B, and 1C, the first conductive layer 20 is a rectangular shape with a thickness, the thickness being much smaller than the length and width. The surface area of the LED 2 is dimension A1 multiplied by dimension A2. The resulting surface area of LEDs 2 and 4 may be 40,000 square microns, 1,000 square microns, 100 square microns, or even smaller values. The present invention is directed towards LEDs with small surface areas less than or equal to 40,000 square microns. In one example, the dimensions A1 and A2 are 5 microns, resulting in an LED surface area of 25 square microns.

Figure 2A:
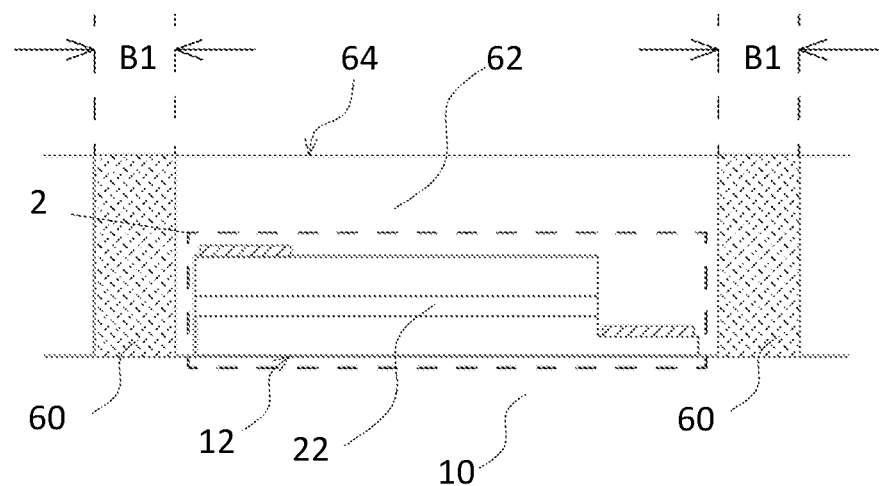
FIG. 2A schematically illustrates a cross sectional view of an LED with side reflectors, FIG. 2B schematically illustrates a plan view of an LED with side reflectors, and FIG. 2C schematically illustrates a cross sectional view of an LED with side reflectors and a reflector layer.

Referring to FIG. 2A, a dielectric layer 62 is disposed on LED 2 as shown in cross section. Dielectric layer 62 may be any suitable material, including but not limited to $SiO_2$, $Al_2O_3$, $TiO_2$, SiN, or combinations thereof, most preferably $SiO_2$. Dielectric layer 62 is substantially transparent to light of the wavelength emitted by the active layer 22 of the LED. Substantially transparent is to mean at least 70% of the light is transmitted through the layer. Dielectric layer 62 can be deposited by any suitable means, such as evaporation, sputtering, CVD, or spin-on techniques, most preferably by CVD. After deposition, dielectric layer 62 may be planarized. Planarization is the process by which the top surface 64 of dielectric layer 62 is rendered substantially parallel to surface 12 of LED substrate 10. Planarization may be accomplished by any suitable technique, including but not limited to chemical mechanical planarization (CMP), wet chemical etch, or plasma etch in corrosive gas, most preferably by CMP. Subsequent steps in fabrication will be described assuming that dielectric layer 62 of FIG. 2A has been planarized. It is to be understood that the fabrication could proceed without this planarizing step. The thickness of dielectric layer 62, which is to mean the distance between surface 12 and surface 64, can be between 0.05 and 100 microns, most preferably about 2 microns.

Figure 2B:
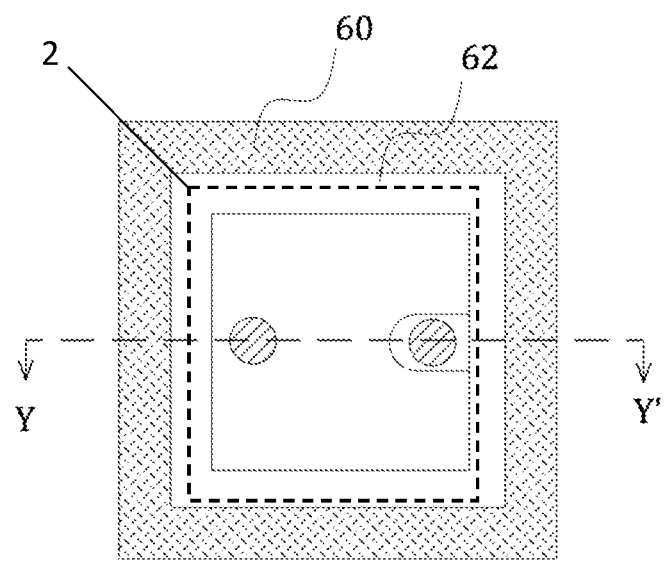

Next, a masking layer such as photoresist (not shown) is applied and patterned, and a portion of dielectric layer 62 is removed by etching in specific locations. The etching may be accomplished by any suitable etchant, such as corrosive gas like $CHF_3$ or wet chemical acid, such as hydrofluoric acid (HF), most preferably by corrosive gas. The masking layer is then removed. Side reflectors 60 are disposed into the cavities of dielectric layer 62 that were removed by the etch, as shown in FIG. 2A. In one example, the side reflectors may have a dimension B1 of 0.2 micron, although any suitable width may be used. As shown in plan view in FIG. 2B, side reflectors 60 will generally be placed next to edges of LED 2. In FIG. 2B, the cross section Y-Y' of FIG.

2A is shown. Depending on the embodiment, any suitable number of side reflectors may be used. For example, if the LED has 4 edges as shown in FIG. 2B, side reflectors may be placed at 1, 2, 3 or 4 of the edges. Side reflectors 60 minimize light from active layer 22 of LED 2 from interfering with light emitted from adjacent light emitting devices, not shown. The side reflectors also help to directionalize the light to the desired direction, as will be shown in subsequent figures. Side reflectors 60 may be any suitable material that substantially reflects light of the wavelength emitted by active layer 22 of LED 2. Substantially reflective is to mean at least 70% of the light is reflected by the layers. Side reflectors 60 may be any suitable material, including but not limited to metals such aluminum, silver, or gold, alloys of aluminum, silver, or gold, or a composite material such as a polymer mixed with metal oxide particles. The metal oxide particles may be, for example, titanium oxide. Side reflectors 60 may be deposited by any suitable technique, such as sputtering, evaporation, electrodeposition, chemical vapor deposition, liquid dispense, or screen printing. Side reflector material that is deposited on surface 64 of dielectric layer 62 in this step is removed afterward by any suitable technique, including but not limited to CMP, wet chemical etch, plasma etch in corrosive gas, or doctor blading, most preferably CMP. Side reflectors 60 can be configured as shown in FIGS. 2A and 2B. If side reflectors 60 are conductive, some portion of the dielectric layer 62 will be disposed between the side reflector and LED to electrically isolate side reflectors 60 from LED 2. In the embodiment described, subsequent steps in fabrication will be described assuming that side reflectors exist. In other embodiments, it is to be understood that fabrication proceeds without side reflectors.

Figure 2C:
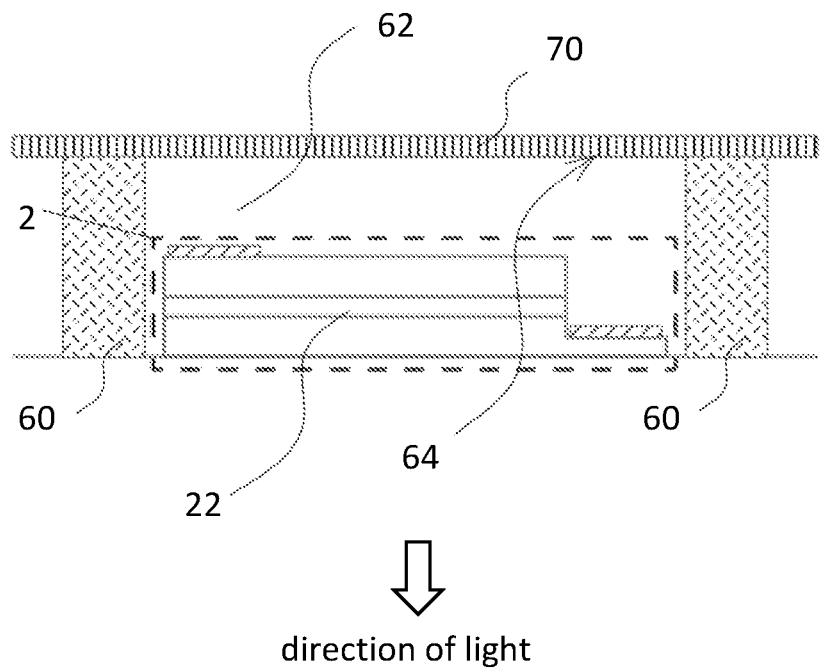

Next, as shown in FIG. 2C, a reflector layer 70 is disposed on surface 64 of dielectric layer 62. Reflector layer 70 may be any suitable material that substantially reflects visible light of the wavelength emitted by active layer 22 of LED 2, such as metals like aluminum, gold, or silver, alloys of aluminum, gold, or silver, a composite material such as a polymer mixed with metal oxide particles, or a distributed Bragg reflector (DBR), most preferably a DBR. A DBR includes one or more pairs of dielectric layers (not shown). Each dielectric layer in a pair has a different index of refraction. The dielectric layers of the DBR may be deposited by any suitable method, including evaporation, sputtering, CVD, or ALD, most preferably by evaporation. The thickness of each dielectric layer in the DBR is designed to be about one quarter of the wavelength of light that is to be reflected. The wavelength of light varies with the index of refraction of each material. For example, for an active layer of an LED that emits blue light with a wavelength from 440 to 460 nm, a suitably reflective DBR would be comprised of one to ten, most preferably five, pairs of aluminum oxide (index of refraction is 1.5 to 1.7) and titanium oxide (index of refraction is 2.3 to 2.7) layers, where the aluminum oxide layer is 67±7 nm thick and the titanium oxide layer is 49±5 nm thick. A reflector layer 70 that is a DBR may comprise silicon oxide, silicon nitride, aluminum oxide, tantalum oxide, or titanium oxide, or any other suitable dielectric materials. In other embodiments, a reflector layer is not disposed on dielectric layer 62. Subsequent steps in the fabrication will be described assuming the reflector layer 70 exists. While reflector layer 70 is shown as a continuous layer in FIG. 2C, it is to be understood that the reflector layer 70 may not be continuous in all embodiments, and there may be multiple reflector layers in other embodiments. As shown in FIG. 2C, LED 2 is now surrounded on three sides in this cross-sectional view by reflective material. This will result in light being directed out the side of LED 2 without reflective material, as shown in FIG. 2C when device fabrication is complete.

Figure 3:
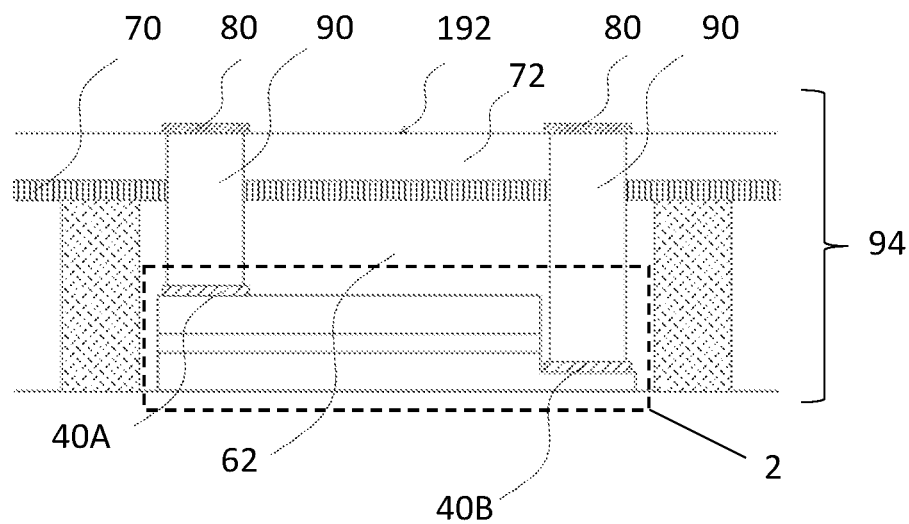
FIG. 3 schematically illustrates a cross sectional view of an LED with portions of interconnects.

Referring to FIG. 3, a dielectric layer 72 is disposed on reflector layer 70. Dielectric layer 72 may be any suitable material, such as $SiO_2$, $Al_2O_3$, $TiO_2$, SiN, or combinations thereof, most preferably $SiO_2$. Dielectric layer 72 can be deposited by any suitable means, such as evaporation, sputtering, CVD, or spin-on techniques, most preferably by CVD. The thickness of dielectric layer 72 may be between 0.05 and 10 microns, most preferably about 0.2 microns.

Next, a masking layer such as photoresist (not shown) is applied and patterned, and portions of layers 72, 70, and 62 are removed by etching in specific locations. At least portions of electrode layers 40 are exposed after this etch is complete. The etching may be accomplished by any suitable etchant, such as corrosive gases like $CHF_3$, $SF_6$, HBr, or wet chemical acid, such as hydrofluoric acid (HF), nitric acid ($HNO_3$), or sulfuric acid ($H_2SO_4$), most preferably by corrosive gas. The masking layer is then removed. Portions of interconnects 90, are then disposed into the cavities where layers 72, 70, and 60 were removed, as shown in FIG. 3. They are referred to as portions of interconnects as they will be joined with other portions to form a complete interconnect between devices in a later step. In one embodiment, the portions of interconnects 90 are cylinder-shaped, with the diameter of the cylinder in contact with electrodes 40, although any suitable shape may be used. In one example, the diameter of the cylinder-shaped portions of interconnects 90 is 0.8 microns, although any suitable size may be used. The portions of interconnects 90 may be made of any suitable material that is conductive, and is preferably substantially transparent to light of the wavelength emitted by the active layer of LED 2, for example light with dominant wavelength 450 to 730 nm. For substantially transparent portions of interconnect 90 may comprise ITO, AZO, FTO, or a conductive polymer such as Poly(3,4-ethylenedioxythiophene, or PEDOT). Examples of portions of interconnects 90 that are not transparent may include but are not limited to titanium, titanium nitride, tungsten, tantalum, tantalum nitride, and aluminum. Portions of interconnects 90 form substantially ohmic contact to electrodes 40. Portions of interconnects 90 may be deposited by any suitable technique, including but not limited to evaporation, CVD, sputtering, evaporation, solution deposition, or spray pyrolysis, most preferably CVD. Interconnect material that is deposited on surface 192 of dielectric layer 72 may be removed by any suitable technique, including but not limited to CMP, wet chemical etch, plasma etch in corrosive gas, most preferably by CMP.

In one embodiment, an adhesive metal layer 80 is disposed on portion of interconnect 90. Adhesive metal layer 80 can be any suitable material which will adhere to portion of interconnect 90 and form an ohmic contact to same. Adhesive metal layer 80 may comprise any suitable material, including but not limited to titanium, chrome, indium, tin, lead, copper, or alloys thereof. Adhesive metal layer 80 may be deposited by any suitable technique, including electroplating, sputtering, or evaporation, most preferably by evaporation. Adhesive metal layer 80 may be between 0.01 and 100 microns thick, most preferably about 0.1 microns. A masking layer (not shown) can be applied and patterned, and then adhesive metal layer 80 can be etched. Adhesive metal layer 80 may be etched by any suitable etchant, including acids or corrosive gas. In one embodiment, if adhesive metal layer 80 comprises indium, it may be etched by a mixture of HCl and HNO$_3$. The masking layer is then removed. In an alternative embodiment, adhesive metal layer 80 is patterned by a lift off process, in which a masking layer (not shown) is first deposited and patterned, and adhesive metal layer 80 is then disposed on the patterned masking layer. The masking layer is then removed ("lifted off"), leaving adhesive metal layer 80 only where there was no masking layer. Subsequent steps in fabrication will be described assuming that adhesive metal layer 80 in FIG. 3 has been formed. It is to be understood that the fabrication could proceed without adhesive metal layer 80. LED apparatus 94 fabrication is now substantially complete.

B. Transistor Apparatus

Figure 4A:
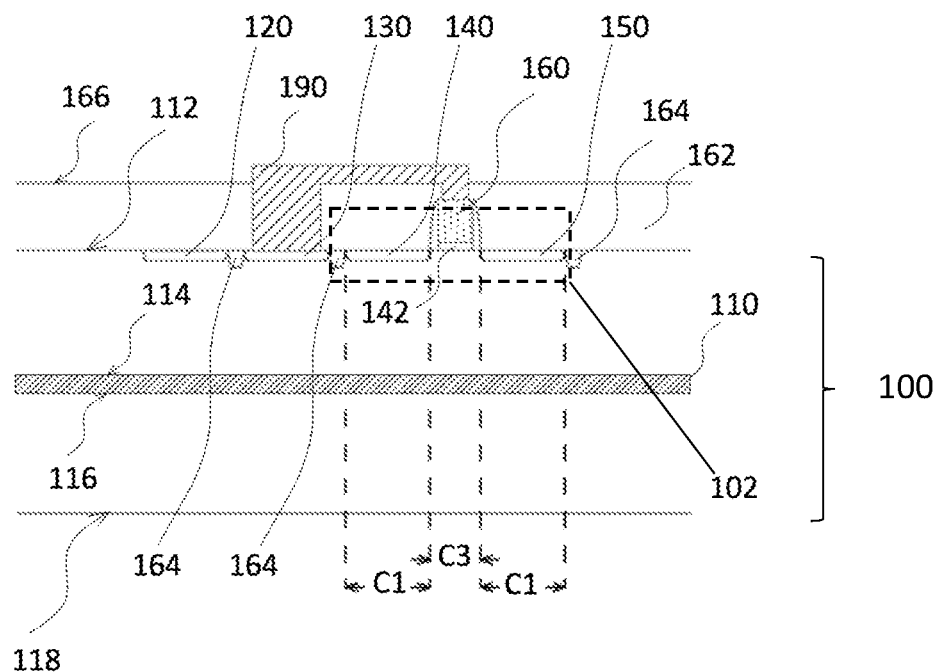
FIG. 4A schematically illustrates a cross sectional view of a transistor formed in the top surface of the transistor substrate, FIG. 4B schematically illustrates a cross sectional view of an example of a conductive region with a silicide layer, FIG. 4C schematically illustrates a cross sectional view of a transistor apparatus, and FIG. 4D schematically illustrates a transistor with an etch-stop layer in contact with the conductive regions.

One embodiment of the fabrication of the transistor apparatus is now described. In this embodiment, a single crystal field effect transistor and fabrication methods will be described. It is to be understood that fabrication of many transistor devices is occurring simultaneously. It is to be understood that any suitable transistor may be used, including but not limited to a field effect transistor or a bipolar transistor. By using single crystal semiconductor for the channel of the transistor, a higher carrier mobility is obtained compared to thin film transistors. In the embodiment shown in FIG. 4A, the transistor 102 is fabricated in top surface 112 of transistor substrate 100. Transistor substrate 100 may be any suitable material, including but not limited to single crystal silicon, single crystal germanium, or single crystal gallium arsenide, most preferably single crystal silicon. Transistor substrate 100 may comprise an etch-stop layer 110. Etch-stop layer 110 has two substantially parallel surfaces 114 and 116, the surfaces also being substantially parallel to top surface 112 of transistor substrate 100. Etch-stop layer 110 is disposed between top surface 112 and the initial bottom surface 118 of the transistor substrate 100. The surface 118 of the transistor substrate 100 is referred to as the initial bottom surface, because in a later step, a portion of transistor substrate 100 including the initial bottom surface 118 will be removed, resulting in a different bottom surface of transistor substrate 100 in the finished device. Etch-stop layer 110 may be any suitable material that has a substantially slower etch rate than transistor substrate 100. In one embodiment, the etch-stop layer may be SiO$_2$, as provided by silicon-on-insulator (SOI) technology. In another embodiment, the etch-stop layer 110 may be boron-doped silicon. The boron-doped silicon layer may be deposited as part of a thicker epitaxial layer deposition on a single crystal silicon wafer that comprises undoped silicon layers. The purpose of the etch-stop layer 110 will be discussed in subsection ID.

Conductive regions 120, 130, 140, and 150 are formed in top surface 112 of transistor substrate 100. Conductive regions 120, 130, 140, and 150 may be fabricated by any suitable technique, for example in one embodiment, by applying a masking layer (not shown), patterning, and then implanting ions. Conductive regions 120, 130, 140, and 150 may be formed by doping a portion of the transistor substrate 100 to be either p-type or n-type. The masking layer is then removed. An anneal may activate the implanted ions. Conductive regions 120, 130, 140, and 150 are more conductive than the surrounding silicon substrate 100. The thickness of conductive regions 120, 130, 140, and 150 may be from 0.01 to 3.0 microns. In one embodiment, conductive regions 120, 130, 140, and 150 may be separated from one another by dielectric regions formed in top surface 112 of transistor substrate 100, examples of which are identified as 164 in FIG. 4A.

Figure 4B:
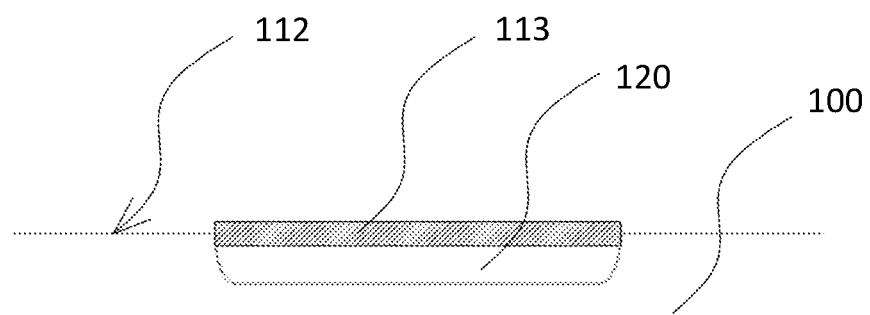

In one embodiment, the conductive regions 120, 130, 140, and 150 may further comprise a silicide layer to decrease the resistance in the conductive regions and/or to facilitate the formation of an ohmic contacts in subsequent fabrication steps. A silicide layer is formed by deposition of a metal, such as Ti, Co, Ni, or W, and then annealing at elevated temperature (above 400° C.) to react the metal with silicon to form a silicide film, for example, TiSi$_2$, CoSi$_2$, NiSi, or WSi$_2$. The silicide layer is in contact with the conductive region. An example of a silicide layer is shown in FIG. 4B, where silicide layer 113 is formed on conductive region 120 of transistor substrate 100 with top surface 112. In the embodiment shown in FIG. 4A and in subsequent embodiments, silicided conductive regions are not shown, but it is to be understood that the conductive regions could include a silicide layer.

In one embodiment, the dielectric regions 164 separating conductive regions 120, 130, 140, and 150 may be shallow trench isolation (STI). Transistor 102 comprises conductive region 140, which may be a source or drain, conductive region 150, which may be a source or drain, a dielectric gate layer 142, a gate layer 160, and a portion of transistor substrate 100 that serves as the channel. The dimensions C1 and C2 of the conductive regions 140 and 150 may be from 0.05 to 20 microns, for example about 0.5 microns. The dimension C3, which may be referred as the gate length, may be from 0.05 to 5 microns, for example about 1.0 micron. In one example, if dimensions C1 and C2 are 0.5 microns and dimension C3 is 1.0 microns, the transistor 102 will have a length of about 2.0 microns. In general, the transistor will be smaller than the LED. Conductive regions 120 and 130 will connect electrically to other wiring structures. Dielectric gate layer 142 may comprise SiO$_2$, SiN, Al$_2$O$_3$, HfSiON, HfSiO$_2$, or any suitable material, most preferably SiO$_2$. The thickness of dielectric gate layer 142 may be between 0.001 and 0.5 microns thick, for example about 0.02 microns. Gate layer 160 may comprise any suitable material, including but not limited to conductive silicon such as doped polysilicon, or a metal such as titanium nitride, tantalum, or tantalum nitride, most preferably doped polysilicon. After transistor 102 fabrication, dielectric layer 162 is disposed on the transistor. Dielectric layer 162 may be any suitable material, including but not limited to SiO$_2$, SiN, or Al$_2$O$_3$, most preferably SiO$_2$. Dielectric layer 162 may be deposited by any suitable technique, including evaporation, sputtering, spin on, or CVD, most preferably CVD. The surface 166 of dielectric layer 162 can be rendered substantially parallel to top surface 112 of transistor substrate 100 by planarization in some embodiments. Planarization can be accomplished by any suitable process such CMP, wet chemical etch, or plasma etch in corrosive gas, most preferably by CMP. Subsequent steps in fabrication will be described assuming that surface 166 of dielectric layer 162 shown in FIG. 4A has been planarized. It is to be understood that the fabrication could proceed without this planarizing step.

A conductive wire 190 may connect gate layer 160 to conductive region 130 on top surface 112 of transistor substrate 100. Conductive wire 190 may be fabricated by any suitable technique. One example of conductive wire 190 fabrication is to deposit a masking layer (not shown), pattern the masking layer, and etch portions of dielectric layer 162 to expose at least a portion of gate layer 160 and conductive region 130. The masking layer is then removed. Any suitable conductive wire material, such as aluminum or tungsten, or a stack of titanium, titanium nitride, and aluminum, or a stack of titanium, titanium nitride, and tungsten, is deposited into the cavities where portions of dielectric layer 162 was removed as well as surface 166. A masking layer (not shown) is formed on the conductive wire material, and the conductive wire is etched, leaving the formed conductive wire 190 as shown FIG. 4A. The masking layer is removed. Gate layer 160 of transistor 102 is now connected electrically to conductive region 130 by conductive wire 190. The principles and mechanisms of field effect transistors and fabrication methods are well known to those skilled in the art, and are thus omitted herein.

Figure 4C:
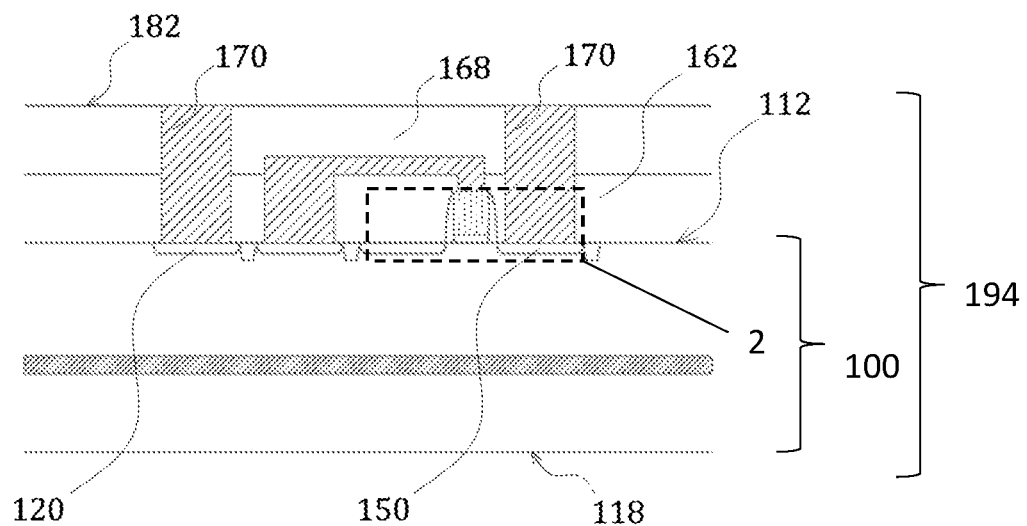

Referring to FIG. 4C, a dielectric layer 168 is then disposed over conductive wire 190 and dielectric layer 162. Dielectric layer 168 may be any suitable material, most preferably $SiO_2$. The surface 182 of dielectric layer 164 may be rendered substantially parallel to top surface 112 of transistor substrate 100 underneath by planarization. Planarization can be accomplished by any suitable process such CMP, wet chemical etch, or plasma etch in corrosive gas, most preferably by CMP. Subsequent steps in fabrication will be described assuming that surface 182 of dielectric layer 168 shown in FIG. 4B has been planarized. It is to be understood that the fabrication could proceed without this planarizing step.

Portions of interconnects 170 are next fabricated. A masking layer (not shown) is deposited and patterned on dielectric layer 168, and portions of dielectric layers 168 and 162 are removed by etching, exposing at least a portion of conductive regions 120 and 150. Dielectric layers 168 and 162 may be etched by any suitable etchant, for example acids or corrosive gases. The masking layer is removed. Interconnect material is deposited into the cavities where portions of dielectric layers 168 and 162 were removed. The portions of interconnects 170 may be any suitable shape. In this example, the portions of interconnects are the shapes of a cylinder, with the circular cross section contacting the conductive regions 120 and 150. The portions of interconnects 170 material may be any suitable material, for example aluminum or tungsten, or a stack of titanium, titanium nitride, and aluminum, or a stack of titanium, titanium nitride, and tungsten, most preferably a stack of titanium, titanium nitride, and tungsten. Each portion of interconnect 170 forms an ohmic contact with conductive regions 120 and 150. The interconnect material may be deposited by any suitable technique, such as evaporation, sputtering, or CVD, most preferably by a combination of sputtering and CVD. Interconnect material that is deposited on surface 182 of dielectric layer 168 may be removed by etching or CMP. An adhesive metal layer (not shown) may be optionally formed on the top surface of portions of interconnects 170. Transistor apparatus 194 fabrication is now substantially complete.

Figure 4D:
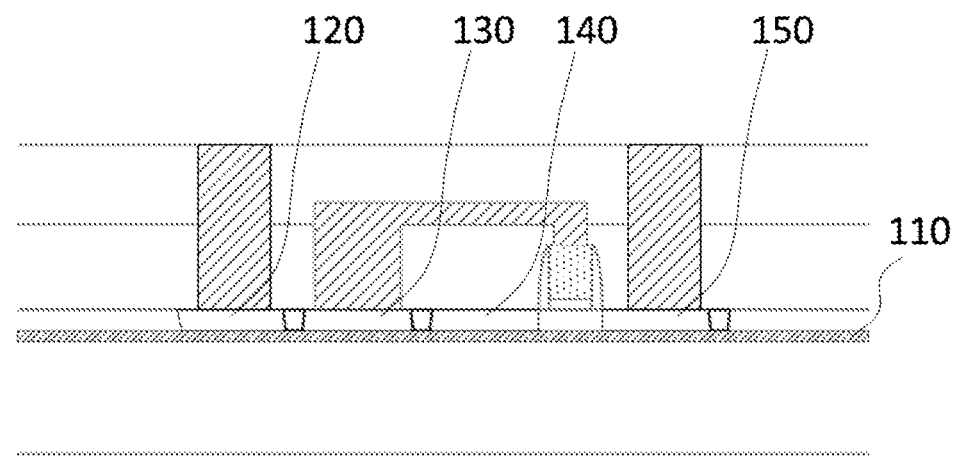

In a different embodiment shown in FIG. 4D, etch-stop layer 110 is in contact with conductive regions 120, 130, 140, and 150. In this example, the etch-stop layer 110 is $SiO_2$.

C. Bonding the LED Apparatus to the Transistor Apparatus

Figure 5:
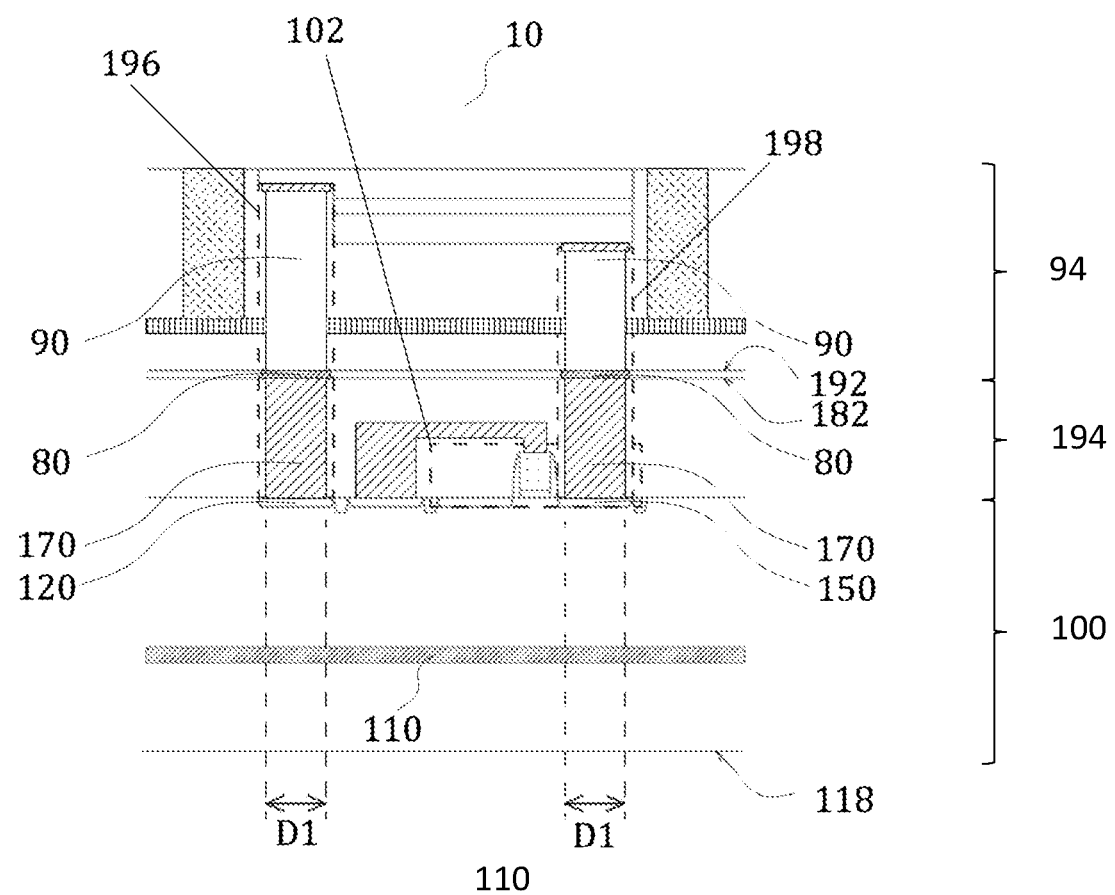
FIG. 5 schematically illustrates a cross sectional view of an LED apparatus after bonding to a transistor apparatus.

Referring to FIG. 5, the LED apparatus 94 is bonded to the transistor apparatus 194 using conventional wafer bonding techniques. In one embodiment, the technique is sometimes referred to as flip-chip bonding as the devices on each respective substrate face one another, and transistor substrate 100 and LED substrate 10 are the outermost surfaces of the bonded apparatus. The device apparatus are bonded such that portions of interconnects 90 of LED apparatus 94 are connected electrically to portions of interconnects 170 of transistor apparatus 194. The completed interconnects 196 and 198 now connect LED 2 to the conductive regions 120 and 150, respectively. In the embodiment shown in FIG. 5, interconnect 196 comprises elements 90, 80, and 170 while interconnect 198 comprises elements 90, 80, and 170. Interconnect 198 connects LED 2 electrically to transistor 102. Lithographic alignment marks in the substrate of each respective apparatus allow the target bonding areas, shown with dimension D1, to be aligned with minimal mismatch. For example, when the target bonding area has a dimension D1 of 1 micron or greater, the wafers may be misaligned by up to ±0.8 micron and still make electrical contact between the two apparatus. Alignment accuracy of ±0.8 micron is easily achieved in present day bonding techniques. Any suitable bonding technique may be used, including but not limited to thermocompression, anodic, plasma activated, eutectic, or surface activated, most preferably anodic bonding. With anodic bonding, LED apparatus 94 and transistor apparatus 194 are brought together as shown in FIG. 5 and an electrostatic field is applied, which causes the apparatus to be connected electrically and physically. If adhesive metal 80 is present, the apparatus are bonded at the point of mutual contact with adhesive metal 80. The surfaces 182 and 192 may or may not be in contact after bonding. In another embodiment, adhesive metal may not be used, with interconnect portions 170 and 90, and interconnect portions 170 and 90 in direct physical and electrical contact after bonding (not shown). The principles and mechanisms of wafer bonding are well known to those skilled in the art, and are thus omitted hereinafter.

D. Conductive Wire Formation Extending from the Conductive Regions of the Transistor Up until this point in the fabrication sequence of this embodiment, both LED substrate 10 and transistor substrate 100 have remained intact, as shown in FIG. 5. Both LED substrate 10 and transistor substrate 100 may be about 500 microns thick, although they may be any suitable thickness that allows for mechanical handling during fabrication. This thickness imparts mechanical stability to the respective substrates, and allows the plurality of devices to be handled during fabrication. With two thick substrates bonded together, one of the substrates can now be removed in whole or in part, and the combined apparatus will retain mechanical stability for handling with one substrate intact.

Figure 6:
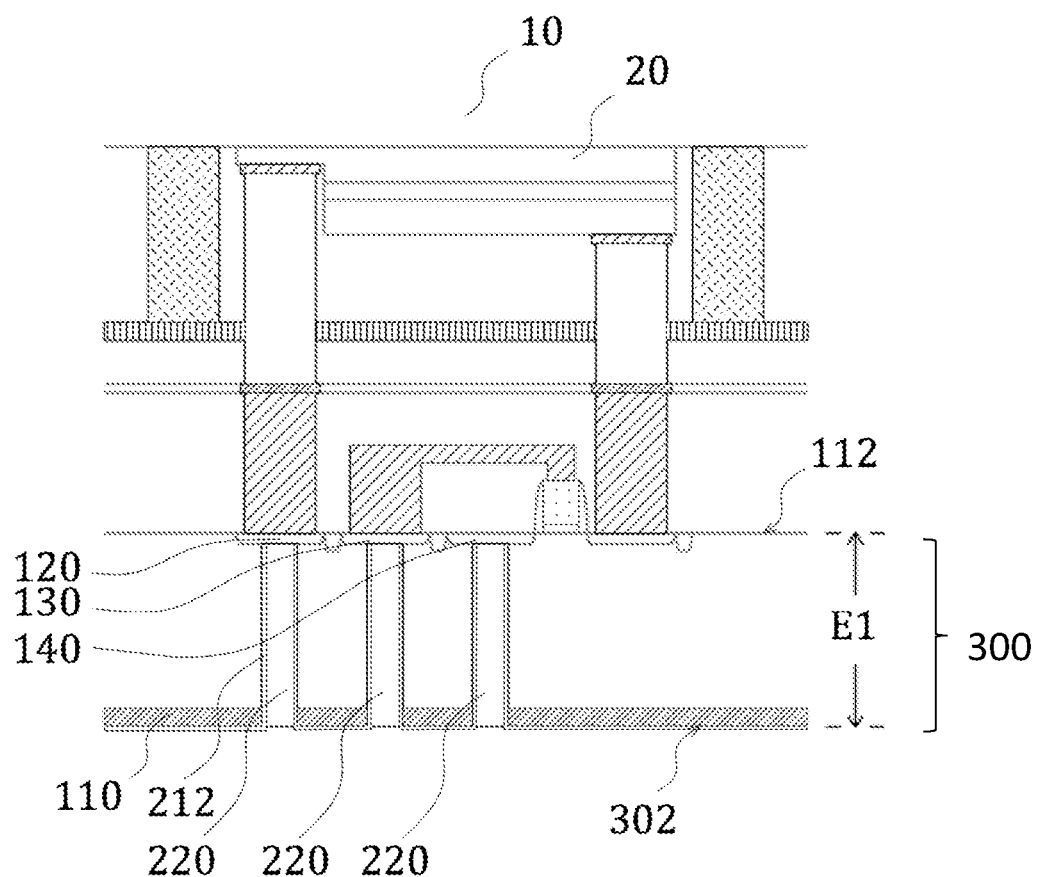
FIG. 6 schematically illustrates a cross sectional view of the LED+transistor apparatus after formation of conductive wires extending from the conductive regions of the transistor substrate.

Referring to FIG. 5, a portion of transistor substrate 100 is now removed. The thickness of transistor substrate 100 can be removed by any suitable wafer thinning technique, including but not limited to laser lift off, mechanical polishing, or chemical etch. In one embodiment, mechanical polishing may be combined with chemical etch to remove a thickness of the transistor substrate 100. By combining mechanical polishing with chemical etching, a more precise thickness of transistor substrate 100 may be removed at lower cost and with greater precision in the remaining substrate thickness than if either technique was used alone. For example, mechanical polishing may first remove about 400 microns of an initial 500 micron-thick transistor substrate 100, resulting in a post-polish transistor substrate thickness of about 100 microns. For wafer thinning by polishing, the wafer is rotated about its center on a surface with abrasive media. Wafer thinning by mechanical force is sometimes referred to as grinding when the remaining substrate surface is rough, and polishing when the remaining substrate surface is smooth. Either grinding or polishing, or a combination, may be used. After grinding and/or polishing, a chemical etch may then remove about 95 microns of the remaining 100 microns, leaving 5 microns of transistor substrate 100. Chemical etch of transistor substrate 100 may be accomplished by any suitable chemistry. For example, KOH, TMAH, $HF+HNO_3$, or $HF+NH_4F$ chemistries may be used to etch silicon substrates. Etch-stop layer 110 acts to slow or stop the rate of substrate grinding, polishing, or etching so that the remaining thickness of transistor substrate may be reliably determined. For example, if KOH is used to etch silicon, KOH will etch undoped silicon about 20× faster than a heavily boron-doped silicon etch-stop layer. The boron-doped layer of silicon acts as an efficient etch-stop for silicon etching. If $SiO_2$ is used as the etch-stop layer, KOH will etch silicon about 500× faster than it will etch $SiO_2$. The $SiO_2$ layer acts as an efficient etch-stop for silicon etching. The initial bottom surface 118 of substrate 100 is removed. Referring to FIG. 6, after removal of a thickness of the transistor substrate, the remaining portion of transistor substrate 300 designated by dimension E1 remains. Bottom surface 302 of transistor substrate 300 is indicated in FIG. 6. In the embodiments shown, etch-stop layer 110 is left intact. The thickness of transistor substrate 300, dimension E1, may be any suitable dimension from 0.1 to 100 microns, in this example about 5 microns.

It may be advantageous to remove a boron-doped etch-stop layer to prevent electrical communication between conductive wires that will be formed in the remaining transistor substrate. For example, the boron-doped silicon etch-stop layer may be removed by a dry etch using corrosive gases. If the etch-stop layer is $SiO_2$, it is preferable to keep the etch-stop layer intact after removal of a portion of the transistor substrate, as the $SiO_2$ will passivate the transistor substrate and help protect it from mobile ion intrusion. If a boron-doped silicon etch stop layer is removed in an embodiment, it may be advantageous to deposit or grow a passivating dielectric layer like $SiO_2$ on the exposed transistor substrate surface. This deposited on grown dielectric layer (not shown) will include the new bottom surface of the transistor substrate. The new transistor substrate bottom surface 302 may be planarized before further fabrication. By removing most of the original transistor substrate 100, wiring structures with small features can now be fabricated in the remaining transistor substrate 300.

Referring to FIG. 6, conductive wires 220 are fabricated by first masking and etching vias in transistor substrate 300. Portions of transistor substrate 300 and etch-stop layer 302, are removed, exposing conductive regions 140, 130, and 120. Cavities are formed where portions of substrate 300 and etch-stop layer 302 were removed. Portions of substrate 300 and etch-stop layer 302 may etched by any suitable etchant, including corrosive gases or chemical acids, most preferably by corrosive gases. The masking layer is then removed. In one embodiment, after etching, a dielectric layer may be formed on the sidewalls of the cavities and the surface 302. An example of the dielectric layer 212 is indicated. The purpose of dielectric layer 212 is to insulate the sidewalls of the via from the conductive wire to follow. This may be preferred if the etch-stop layer is boron-doped silicon and the etch-stop layer has been left intact after a thickness of substrate 300 has been removed. Dielectric layer 212 may comprise any suitable material, including but not limited to $SiO_2$ or SiN, most preferably $SiO_2$. Dielectric layer 212 may be deposited by any technique with good step coverage, most preferably by CVD. A portion of dielectric layer 212 that is disposed on conductive regions 120, 130, or 140 can be removed by an anisotropic etch in order to allow the conductive wire that follows to make electrical contact. A portion of dielectric layer 212 remains on the sidewalls of the vias and on surface 302 after the anisotropic etch. In other embodiments, a dielectric layer is not needed on the sidewalls of the vias or surface 302, for example when transistor substrate 300 and/or etch-stop layer 110 is not substantially conductive.

Next, conductive wires 220 are deposited in the cavities. The conductive wire material may comprise any suitable material, for example metals, including but not limited to aluminum, copper, or tungsten, or a stack of titanium, titanium nitride, and aluminum layers, or a stack of titanium, titanium nitride, and tungsten layers, or a stack of tantalum, tantalum nitride, and copper layers, most preferably a stack of titanium, titanium nitride, and tungsten. Any suitable method for deposition may be used, such as evaporation, sputtering, or CVD, most preferably a combination of sputtering and CVD for the stack titanium, titanium nitride, and tungsten. Conductive wire material on surface 302 can be removed by etching or CMP, most preferably by CMP, leaving conductive wires 220, as shown in FIG. 6. Conductive wires 220 can be referred to as through-silicon vias (TSVs). However, conventional TSVs typically extend through much thicker substrates, for example more than 100 microns thick, which makes the feature sizes of those TSVs much larger than the TSVs of the present invention. Dielectric layer 212, if present, can prevent electrical connection of conductive wires 220 to transistor substrate 300. Conductive wires 220 make connections electrically to conductive regions 140, 130, and 120. LED substrate 10 remains on the apparatus at this point in fabrication.

E. Bonding the LED+Transistor Apparatus to the Back Board

Figure 7:
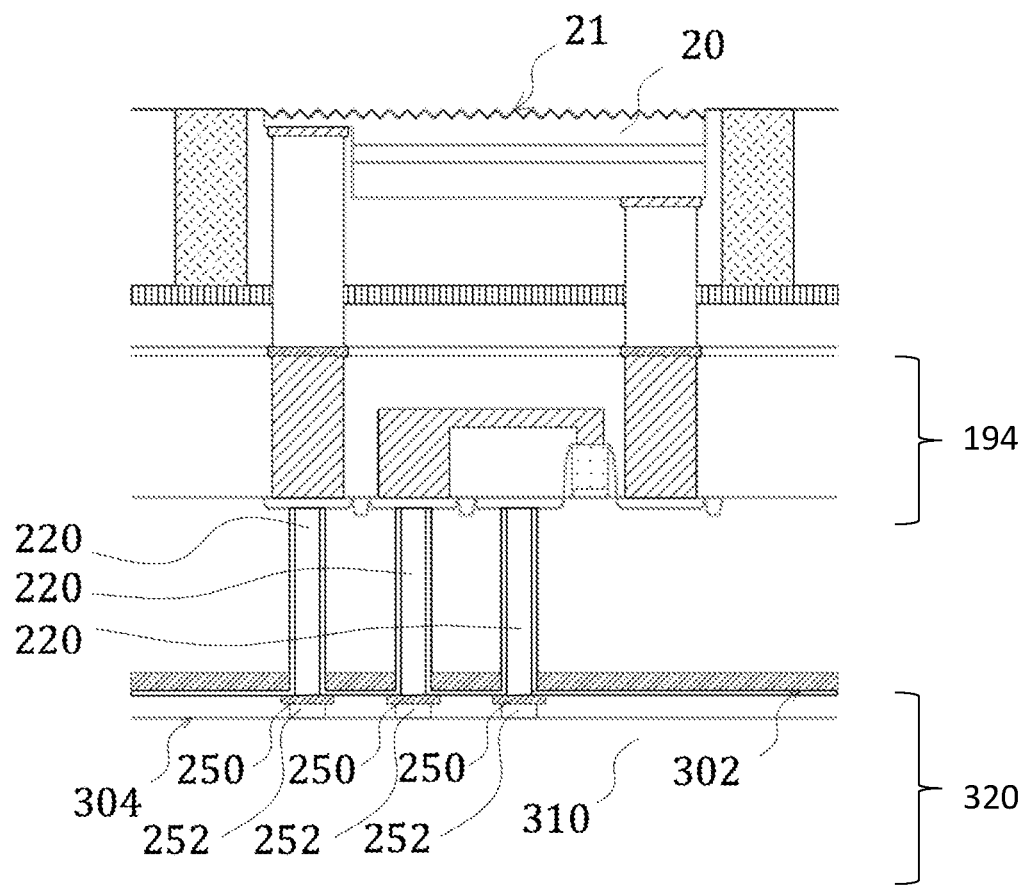
FIG. 7 schematically illustrates a cross sectional view of the transistor+LED apparatus after bonding the conductive wires of the transistor apparatus to the metal interconnects of the backboard.

Referring to FIG. 7, the LED+transistor apparatus is bonded to the backboard 320. Backboard 320 may comprise backboard substrate 310 with a plurality of metal interconnects 252 and a plurality of adhesive metal layers 250. Backboard substrate 310 may comprise FR-4, BT (Bismaleimide-Triazine) resin, ceramics, silicon, or glass. The thickness of backboard substrate 310 may be between 50 and 2000 microns. In one embodiment, metal interconnects 252 on backboard substrate 310 may be fabricated by metal deposition, masking, etch, and mask removal. In a different embodiment, metal interconnects 252 may be fabricated by a damascene process in a dielectric layer. Metal interconnects 252 may be fabricated by any suitable method. Metal interconnects 252 may be fabricated as a single layer, or as multiple layers on backboard substrate 310. In one embodiment, backboard 320 may be a printed circuit board (PCB) comprising FR-4 substrate and copper interconnects. In a different embodiment, backboard 320 may be an interposer comprising a silicon or glass substrate with metal interconnects 252 comprising copper or aluminum. An interposer can generally provide smaller feature sizes and pitches of metal interconnects compared with a PCB, and an interposer is preferred for this reason. The interposer may comprise such aspects as metal interconnects 252 and/or adhesive metal layers 250 defined by conventional masking and lithography, etch and mask removal, micro bump connections, ball or stud bumps, copper paste, TSVs, or any suitable feature needed to connect to the transistors to other devices to form a display.

The LED+transistor apparatus is bonded to the backboard by aligning metal interconnects 252 to conductive wires 220 and making physical and electrical connections between them as shown in the embodiment in FIG. 7. Adhesive metal layers 250 may be used to promote bonding and/or electrical connection between the metal interconnects 252 and conductive wires 220. After bonding, metal interconnects 252 are connected electrically to transistor apparatus 194. In other embodiments, an adhesive metal layer may not be used, and in these cases, there is a direct bond between conductive wires 220 and metal interconnects 252 (not shown). Adhesive metal layers 250 may be disposed on the conductive wires 220 or on the backboard 310, or both, prior to bonding. Adhesive metal layers 250 may be any suitable material, including but not limited to titanium, gold, chrome, gold, indium, tin, or lead, or alloys thereof. Any suitable bonding technique may be used, including but not limited to thermocompression, adhesive, anodic, plasma activated, eutectic, or surface activated, most preferably themocompression bonding. If adhesive metal is used, the apparatus are bonded at the point of mutual contact with the adhesive metal. Other techniques may be used to physically and connect electrically metal interconnects 252 to conductive wires 220 including but not limited to ball or stud bumps, copper paste, and copper-copper direct bonding. After bonding, surfaces 302 and 304 may or may not be in contact. The principles and mechanisms of bonding are well known to those skilled in the art, and are thus omitted hereinafter. With the LED+transistor apparatus now bonded to a backboard 320 which provides mechanical support, LED substrate 10 can now be removed, as will be described.

F. Formation of Wavelength-Converting Layer

Some portion or all of LED substrate 10, shown in FIG. 6, may be removed after bonding the LED+transistor apparatus to the backboard. In other embodiments, the LED substrate may not be removed if the LED substrate is substantially transparent to light emitted by the active layer of the LED. LED substrate 10 may be removed by a laser process. If LED substrate 10 is sapphire, a KrF Excimer laser with an energy density of 400 mJ/cm$^2$, a wavelength of 248 nm, and a pulse width of 38 ns can irradiate the sapphire surface at an elevated temperature of 60° C. and remove the sapphire substrate from first conductive layer 20 shown in FIG. 6. If LED substrate 10 is GaAs, a solution of $NH_4OH$: $35H_2O$ or a solution of $5H_3PO_4$:$3H_2O_2$:$3H_2O$ can be applied to remove the GaAs substrate from first conductive layer 20. If LED substrate 10 is silicon, a solution of KOH, TMAH, $HF+HNO_3$, or $HF+NH_4F$ can be applied to remove LED substrate 10 from first conductive layer 20.

Referring to FIG. 7, after the LED substrate is removed, surface 21 of first conductive layer 20 may be roughened to enhance light extraction from the LED. For example, if first conductive layer 20 is GaN or AlGaInN, surface 21 can be roughened by etching in a solution of KOH. If first conductive layer 20 is GaP, AlGaP, or AlGaNInP, a solution of HCl and $H_3PO_4$ can roughen surface 21. If first conductive layer 20 is GaP, a corrosive gas mixture of $BCl_3$, $Cl_2$, and Ar can roughen surface 21. In other embodiments, first conductive layer 20 is not roughened.

Figure 8:
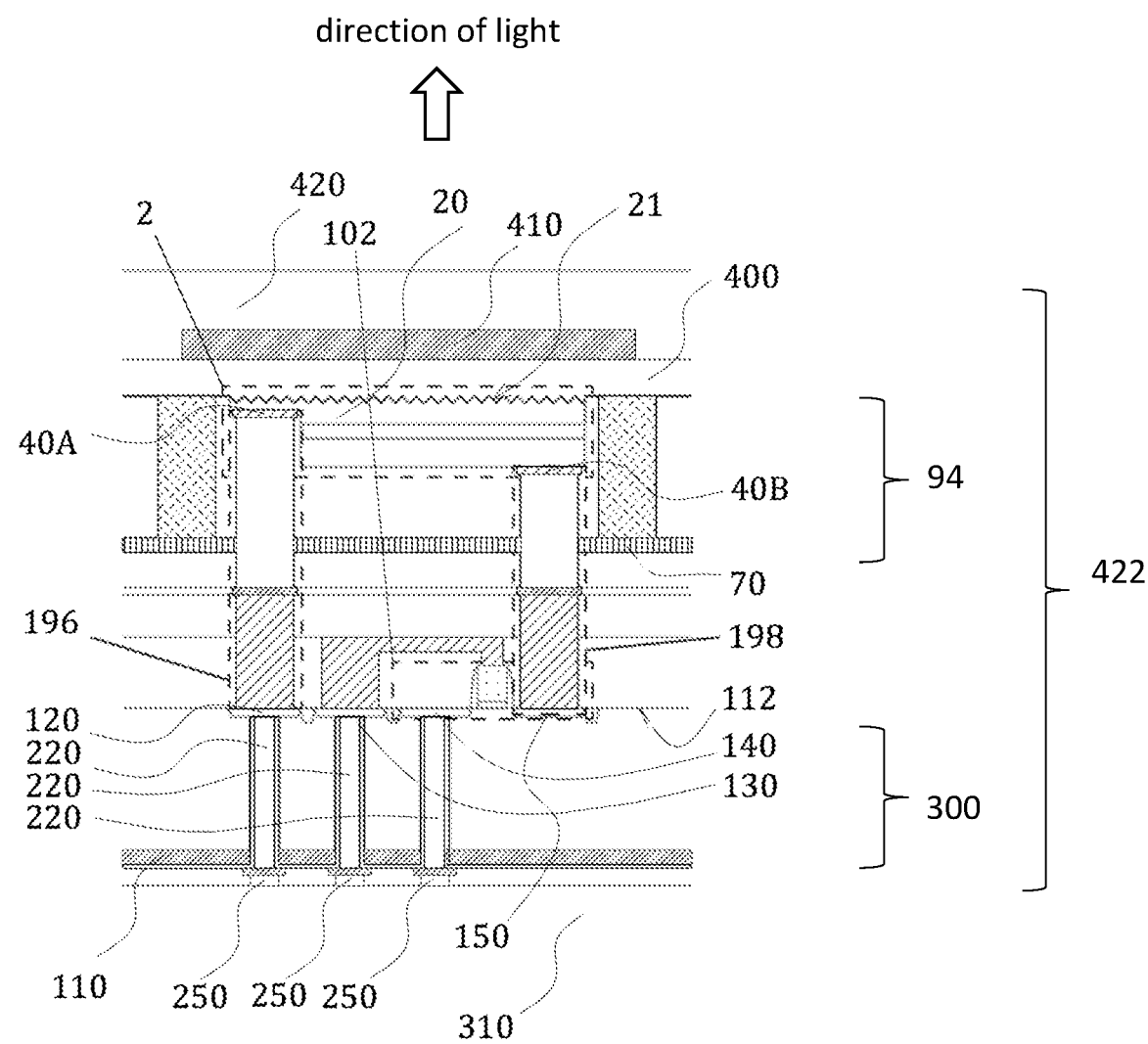
FIG. 8 schematically illustrates a cross sectional view of a light emitting device.

Referring to FIG. 8, after surface 21 of first conductive layer 20 is roughened, a dielectric layer 400 is disposed on surface 21. In other embodiments, a dielectric layer is not disposed on surface 21. Dielectric layer 400 is substantially transparent to light of the wavelength emitted by the active layer of LED 2. Dielectric layer 400 may be any suitable material, for example $SiO_2$, SiN, $Al_2O_3$, $TiO_2$, or combinations thereof, most preferably $SiO_2$. Dielectric layer 400 can be deposited by any suitable means, including evaporation, sputtering, or CVD, most preferably CVD. Dielectric layer 400 may be between 0.05 and 100 microns thick, in this example about 1 micron thick. In other embodiments, a dielectric layer is not deposited. In some embodiments, dielectric layer 400 may be planarized after deposition.

Wavelength-converting layer 410 is next disposed on dielectric layer 400. In embodiments where there is no dielectric layer on surface 21, a wavelength-converting layer is disposed directly on surface 21. Wavelength-converting layer 410 will be excited by the light emitted by the active layer of LED 2 and emit light of a different wavelength. In a specific embodiment, wavelength-converting layer 410 may be an organic material, for example silicone, epoxy, or polycarbonate, combined with inorganic phosphor particles such as GaAlN, with the GaAlN phosphor particles excited by light with a dominant wavelength of between 420 and 470 nm (blue) and emitting light with a dominant wavelength of between 500 and 550 nm (red). In different embodiment, the phosphor particles may be CaAlSiN:Eu, with CaAlSiN:Eu phosphor particles excited by light with a dominant wavelength of between 420 and 470 nm (blue), and emitting light with a dominant wavelength of between 610 and 730 nm (green). Any suitable phosphor particle may be used. In another embodiment, silicone, epoxy, or polycarbonate may be combined with quantum dots, the quantum dots being nano-scale semiconductor material, for example group II-VI material having a composition ZnCdMgSe, CdSe, InP, or ZnS. In one embodiment, the composition of the quantum dots can be optimized to emit red (500 to 550 nm) or green (610 to 730 nm) light when excited by blue light (420 to 470 nm). Any suitable quantum dot composition may be used. In one embodiment, wavelength-converting layer 410 may be screen printed into any suitable pattern on the wafer.

In a different embodiment, wavelength-converting layer 410 may be phosphor particles or quantum dots embedded in glass, a technique known as phosphor-in-glass (PiG) or quantum dot-in-glass (QDiG). In one embodiment, glass paste combining $SiO_2$, $B_2O_3$, phosphor particles or quantum dots, adhesive, and organic solvent may be screen printed in a pattern on dielectric layer 400 using a stencil. In a different embodiment, the glass paste with phosphor particles or quantum dots may be screen printed on dielectric layer 400 without a pattern. The volatile organic components of the glass paste may be removed by drying at 150° C. and sintering at 600° C. In a different embodiment, the PiG or QDiG layer may be deposited by a spin-on technique, in which chemicals and phosphor particles or quantum dots are suspended in organic solvents. The solution is spun onto dielectric layer 400 as a film. The film is dried and annealed, which substantially removes the organic materials, leaving a glass film with phosphor particles or quantum dots. The glass film with phosphor particles or quantum dots is wavelength-converting layer 410. If the wavelength-converting layer 410 was not patterned, masking layer (not shown) can be applied, patterned, and wavelength-converting layer 410 etched to form a pattern. Wavelength-converting layer 410 may be etched by any suitable etchant, including but not limited to acids or corrosive gases. The masking layer is removed. Wavelength-converting layer 410 may be realized in its smallest form by the technique of depositing PiG or QDiG in blanket film form, patterning the film with a mask, etching, and then removing the mask,.

A passivating layer 420 can be disposed on wavelength-converting layer 410. Passivating layer 420 protects light emitting device 422 from moisture intrusion and/or mobile ions which might degrade it. Passivating layer 420 can be any suitable material which is substantially transparent to light of the wavelength emitted by the active layer of the LED and/or the wavelength emitted by the wavelength-converting layer 410. In embodiments in which there is no wavelength-converting layer, dielectric layer 400 can act as a passivating layer. In other embodiments, dielectric layer 420 and dielectric layer 400 can act as passivating layers if wavelength-converting layer 410 is not present. If wavelength-converting layer 410 contains organic materials, which are sensitive to elevated temperature, passivating layer 420 can be an organic material, including but not limited to silicone, epoxy, or polycarbonate. Use of an organic material for passivating layer 420 can avoid high temperature processing that could compromise wavelength-converting layer 410 if wavelength-converting layer 410 was organic. If wavelength-converting layer 410 is PiG or QDiG, both of which are less sensitive to elevated temperature than an organic material such as silicone, epoxy, or polycarbonate, then passivating layer 420 may comprise either an organic layer such as silicone, epoxy, or polycarbonate or an inorganic dielectric material such $SiO_2$, SiN, $Al_2O_3$, or $TiO_2$, most preferably an inorganic dielectric material. The inorganic dielectric material for passivating layer 420 can be deposited by any suitable method, including evaporation, sputtering, or CVD, most preferably CVD. If passivating layer 420 is $SiO_2$, the layer may be between 0.02 and 10 microns thick, in this example about 0.5 microns. Fabrication of light emitting device 422 is now substantially complete in this embodiment.

During operation of light emitting device 422, electrical signals are routed through metal interconnects 250 on backboard 320 to transistor 102. In one embodiment, when the gate of transistor 102 is turned on, electric current can flow through transistor 102 to LED 2 by interconnect 198, causing LED 2 to emit light. If there is a wavelength-converting layer 410 overlying LED 2, the light emitted by LED 2 will be absorbed by wavelength-converting layer 410 and then re-emitted with a different wavelength. In another embodiment, when the gate of transistor 102 is turned off, electric current can flow through transistor 102 to LED 2, causing it to emit light. There are many possible configurations of electrical connections between metal interconnects 250, transistor 102, interconnects 196 and 198, and LED 2 that would make a functional device in the present invention, and only one has been shown in the preceding example.

Summarizing, FIG. 8 shows one embodiment of a light emitting device 422. In the completed device, LED 2 (now inverted from its fabrication orientation) having a surface area is above and at least partially overlying transistor 102. Transistor substrate 300 has a top surface 112. Transistor 102 is formed in top surface 112 of transistor substrate 300. Conductive regions 120, 130, 140, and 150 are in the top surface 112. Conductive wires 220 extend from one of the conductive regions 140, 130, and 120. Interconnect 198 extends from LED 2 and connects LED 2 to transistor 102. Reflector layer 70 is disposed between LED 2 and transistor 102. The wavelength-converting layer 410 at least partially overlies LED 2.

Figure 9:
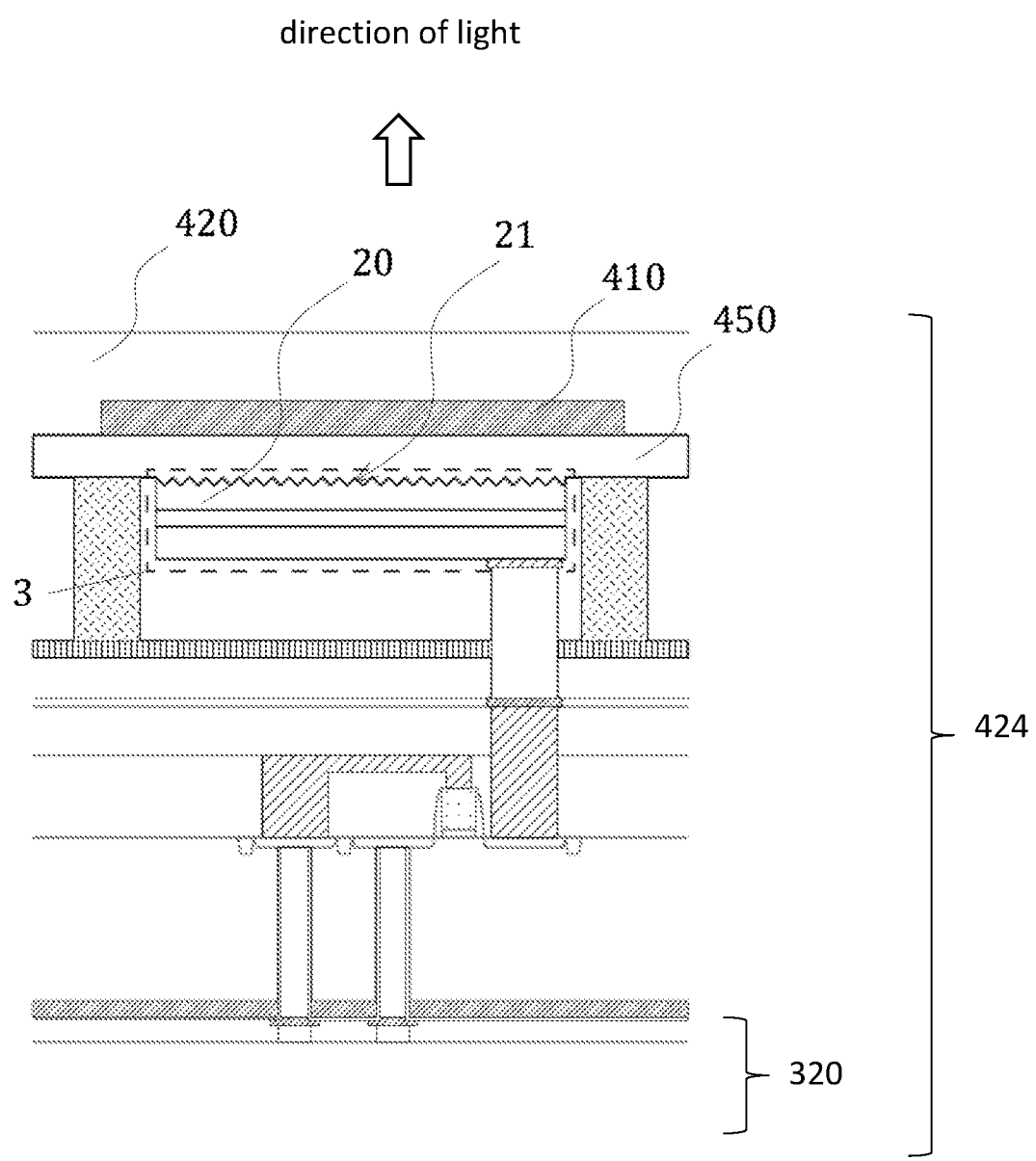
FIG. 9 schematically illustrates a cross sectional view of a light emitting device with a transparent conducting layer.

A different embodiment of a light emitting device 424 is shown in FIG. 9. In this embodiment, a transparent conductive layer 450 makes an ohmic contact to the first conductive layer 20 of LED 3. Transparent conductive layer 450 may be any suitable material, including but not limited to indium tin oxide (ITO), aluminum zinc oxide (AZO), fluorine-doped tin oxide (FTO), or a stack of a thin nickel layer followed by a thin gold layer. Transparent conductive layer 450 may be deposited by any suitable technique, such as evaporation, CVD, or sputtering, most preferably evaporation. The same transparent conductive layer may make electrical contact to the first conductive layer of other LEDs or other devices in a display (not shown). An interconnect (not shown), may connect electrically transparent conductive layer 450 to a metal interconnect on backboard 320. In a different embodiment (not shown), a dielectric layer may be disposed between the transparent conductive layer 450 and wavelength-converting layer 410.

II. Light Emitting Assembly

Figure 10A:
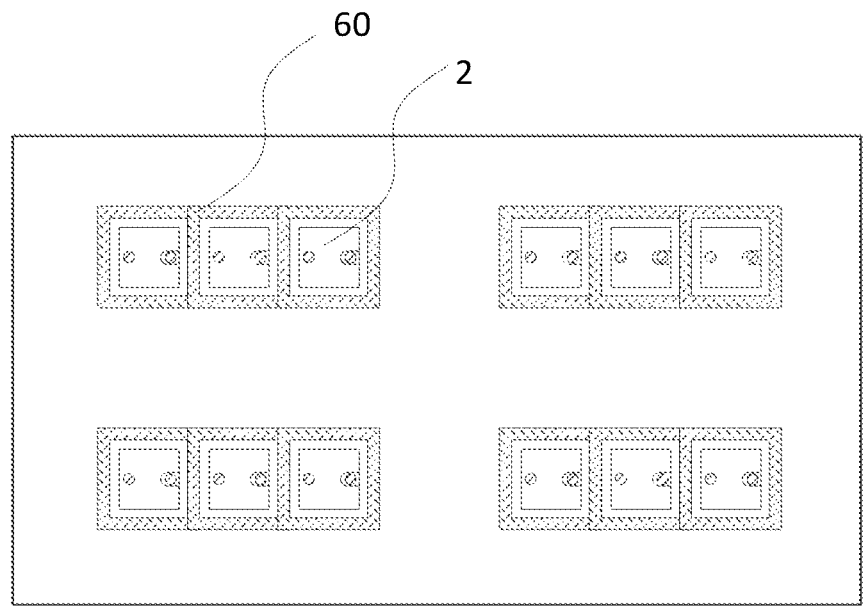
FIGS. 10A, 10B, and 10C schematically illustrate plan views of groups of LEDs with side reflectors, where the groups of LEDs have been formed with varying shapes, sizes, and configurations.
Figure 10B:
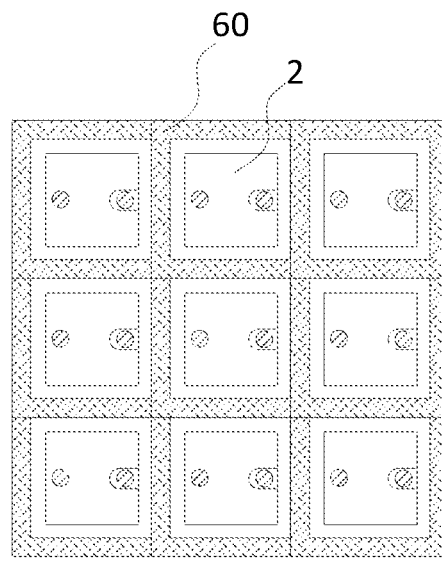
Figure 10C:
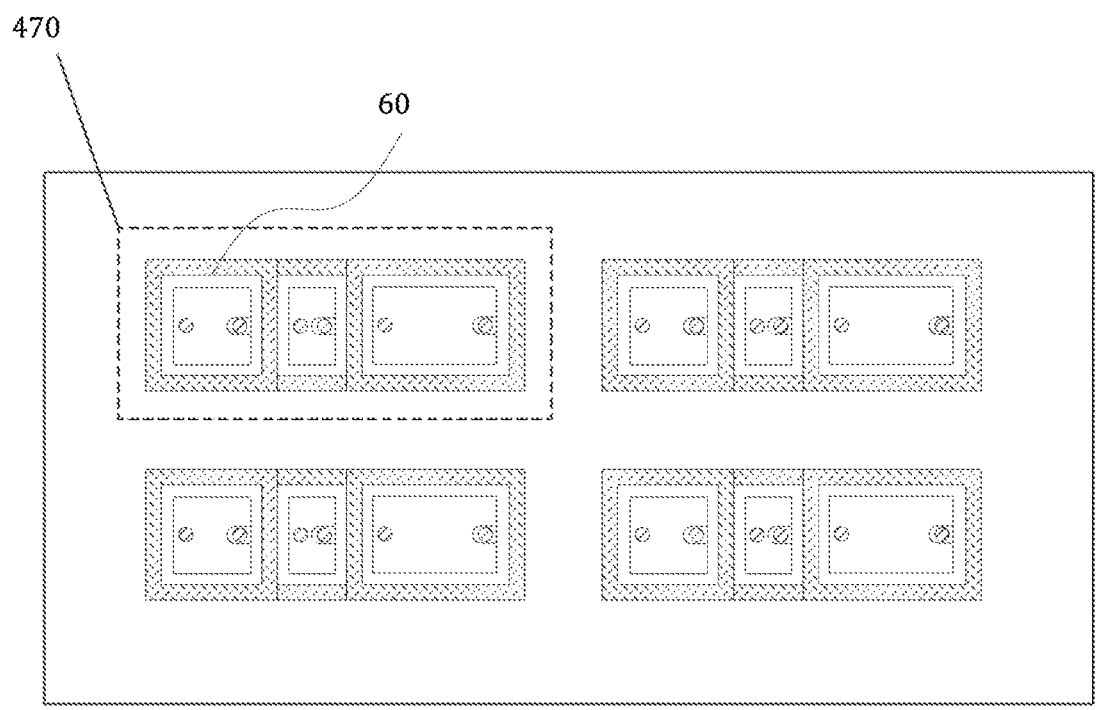

The previous discussion has shown embodiments of the fabrication of a single light emitting device by the present invention, although it may be one of many light emitting devices fabricated simultaneously. The fabrication of a light emitting assembly will now be discussed. The light emitting assembly will comprise a plurality of light emitting devices. The finished assembly may be diced from an even larger plurality of light emitting devices. The light emitting assembly will be fabricated using one LED substrate and one transistor substrate with a plurality of LED apparatus and a plurality of transistor apparatus on each, respectively. FIGS. 10A, 10B, and 10C are plan view schematics of several possible shapes and configurations of LEDs for an assembly of light emitting devices. FIGS. 10A, 10B, and 10C show embodiments of LED configurations in plan view before fabrication of the light emitting devices are complete. It is to be understood that the plan view schematics of FIGS. 10A, 10B, and 10C show only a portion of several, several hundred, thousand, or millions of LEDs arranged in the same manner on a LED substrate. There are many possible shapes and configurations, and only a few examples are shown, without limitation of the present invention. FIG. 10A shows 4 groups of LEDs, each group having three LEDs, each LED 2 in the group having the same surface area, with sidewall reflectors 60 and spacing between groups of LEDs. FIG. 10B shows a group of 9 LEDs, each LED 2 having the same surface area and surrounded by sidewall reflectors 60. FIG. 10C shows 4 groups of LEDs, each group having three LEDs, each LED surrounded by sidewall reflectors 60. The LEDs within one group 470 each has a different surface area. Fabrication of the assembly of light emitting devices occurs similar to the description in the previous section for a single light emitting device, with some difference in the wavelength-converting layers.

Figure 11A:
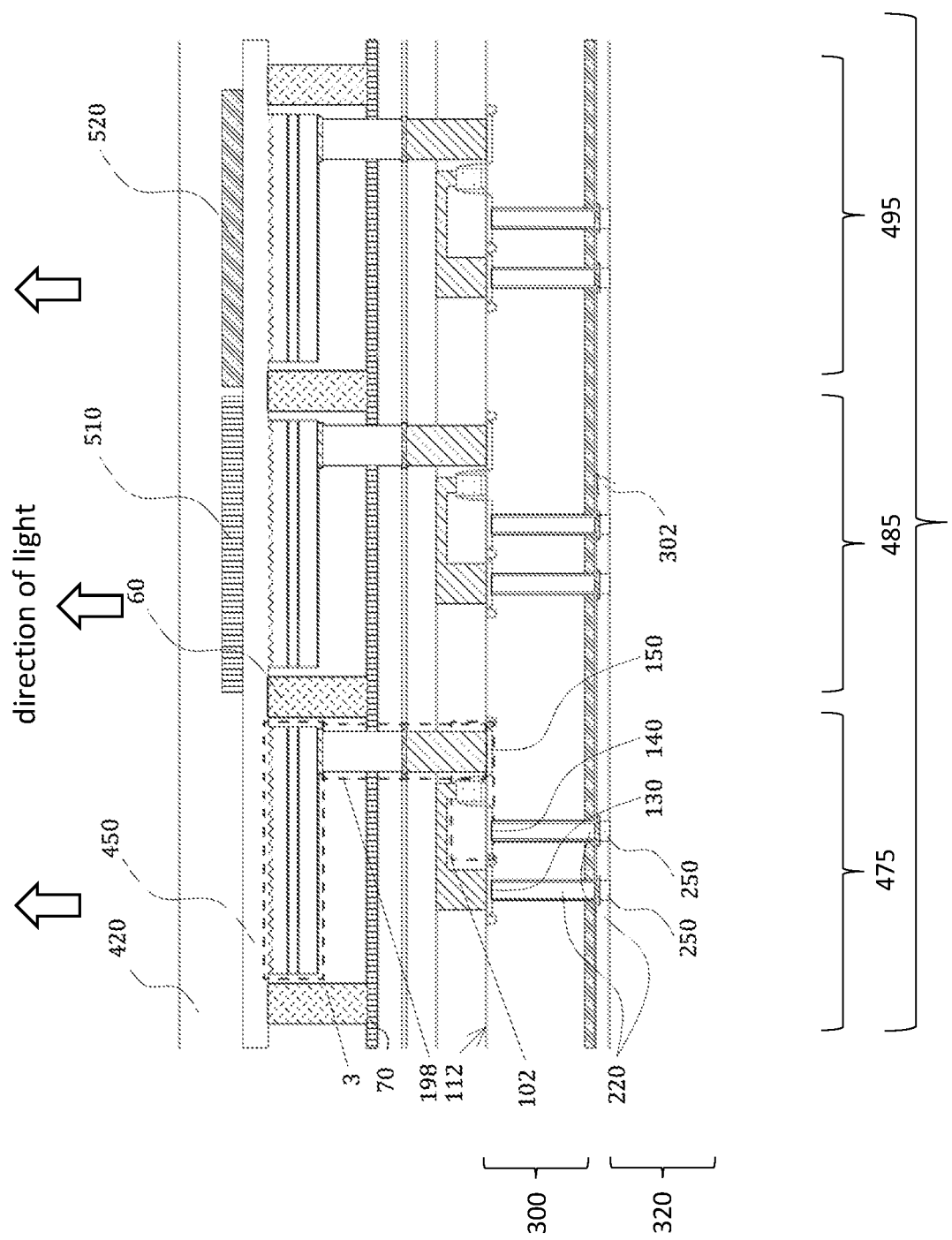
FIGS. 11A and 11B schematically illustrate cross sectional views of a light emitting assemblies, where the wavelength-converting layers have been formed on the same, and different planes, respectively.

One embodiment of an assembly of light emitting devices is shown in cross sectional schematic in FIG. 11A. The arrangement of LED apparatus in the assembly will be matched to a corresponding arrangement of transistor apparatus, with one transistor apparatus per LED apparatus. The light emitting devices will share the same transistor substrate. FIG. 11A shows an assembly with a group 460 of three light emitting devices 475, 485, and 495. It is to be understood there may be many more light emitting devices in the assembly than shown in the FIG. 11A. There is a transistor substrate 300 having a top surface 112 and a bottom surface 302. There is a plurality of conductive wires, examples of which are shown as 220 in light emitting device 475, which extend from conductive regions 130 and 140. There is a plurality of transistors formed in the top surface 112 of transistor substrate 300, an example of which is shown as 102. There is a plurality of LEDs, each with a surface area, an example is shown as LED 3, which overlies transistor 102. There is a plurality of interconnects, wherein one interconnect connects one transistor to one LED electrically. Portions of the interconnects may be transparent to visible light, for example light with wavelength 450 to 730 nm. An example of an interconnect is shown as 198, connecting LED 3 to transistor 102. There is a plurality of side reflectors, examples of which are shown as 60. There is at least one reflector layer 70 disposed between each LED and its corresponding transistor. The light emitting devices are connected electrically to metal interconnects 250 of backboard 320. The active layer of each LED in the group of three in this example may emit light of the substantially the same dominant wavelength, for example, light with dominant wavelength 420 to 470 nm (blue). In the embodiment shown in FIG. 11A, the LED of light emitting device 475 does not have a wavelength-converting layer overlying the LED, and light emitting device 475 will emit light of the same dominant wavelength as the active layer of the LED. Light emitting device 485 has wavelength-converting layer 510 overlying it. Wavelength-converting layer 510 of light emitting device 485 may absorb light with dominant wavelength of between 420 and 470 nm (blue) and emit light with a dominant wavelength of between 500 and 550 nm (red). Light emitting device 495 has a wavelength-converting layer 520 overlying the LED. Wavelength-converting layer 520 of light emitting device 495 may absorb light with dominant wavelength of between 420 and 470 nm (blue) and emit light with a dominant wavelength of between 610 to 730 nm (green). In this embodiment, group 460 of light emitting devices may emit red, green, or blue light, or combinations of these light colors. Group 460 may comprise a pixel in a color display. In other embodiments, a group of three light emitting devices may emit cyan, magenta, or yellow, or combinations of these light colors, to form a pixel in a different color display. In a different embodiment (not shown), a group of light emitting devices would not have any wavelength-converting layers overlying them, and therefore each light emitting device would emit light of the same dominant wavelength, suitable for use in a monochromatic display. The arrangement of light emitting devices and wavelength-converting layers may be accomplished in any suitable manner. There may be one, two, three or more different kinds of wavelength-converting layers in an assembly that emit one, two, three, or more different wavelengths of light.

Figure 11B:
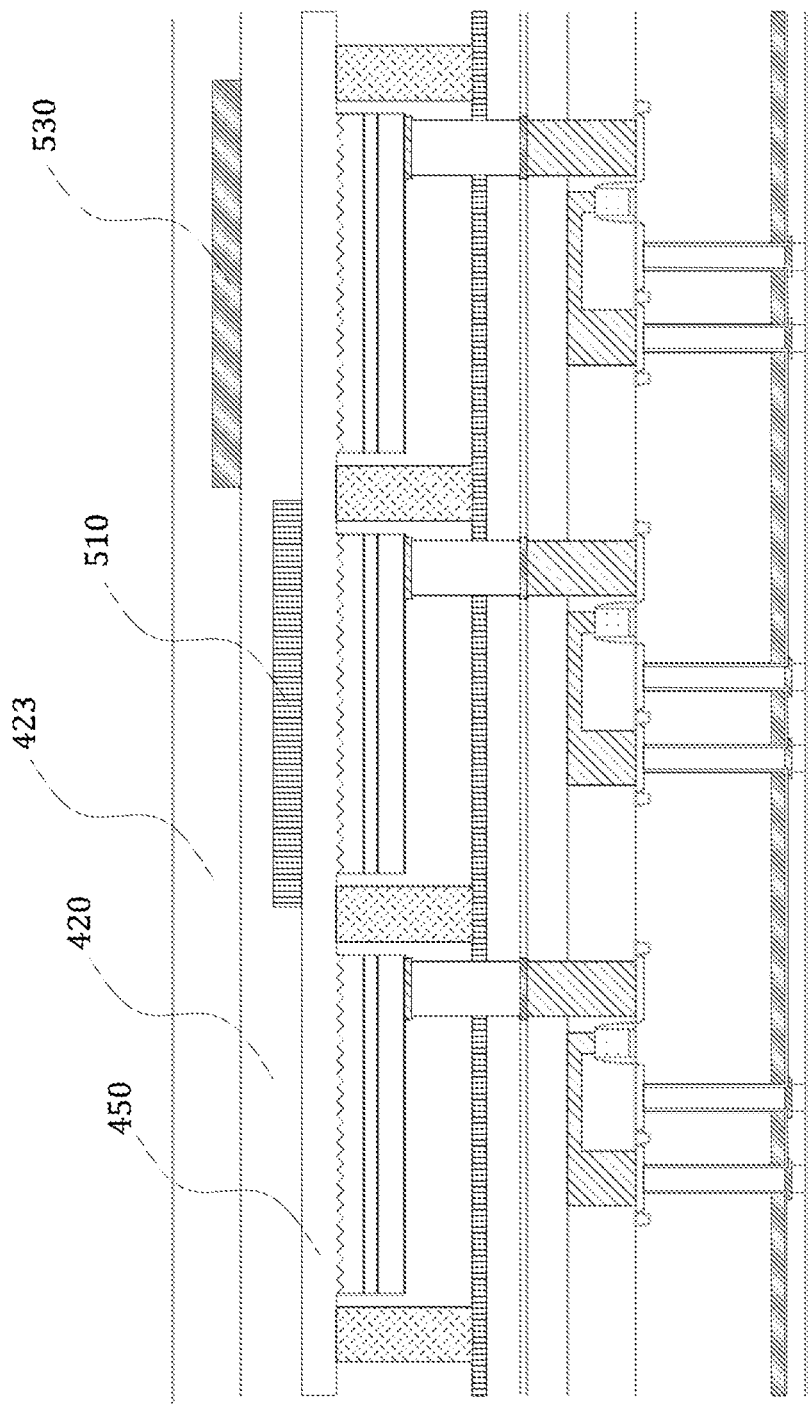

Referring to FIG. 11B, another embodiment of an assembly of light emitting devices is shown in cross sectional schematic. FIG. 11B shows only a portion of the light emitting devices of the assembly, and it is to be understood there may be many more light emitting devices than shown in the FIG. 11B. In this embodiment, the wavelength-converting layers 510 and 530 are disposed on different dielectric layers overlying the LEDs. Wavelength-converting layer 510 is disposed on transparent conductive layer 450. A dielectric layer 420 is disposed on transparent conductive layer 450 and wavelength-converting layer 510. Wavelength-converting layer 530 is disposed on a dielectric layer 420. Dielectric layer 423 is disposed on dielectric layer 420 and wavelength-converting layer 530. In this manner, each wavelength-converting layer may be fabricated and partitioned from different wavelength-converting layers. In other embodiments, there may be even more dielectric and wavelength-converting layers than shown in FIG. 11B.

Figure 12:
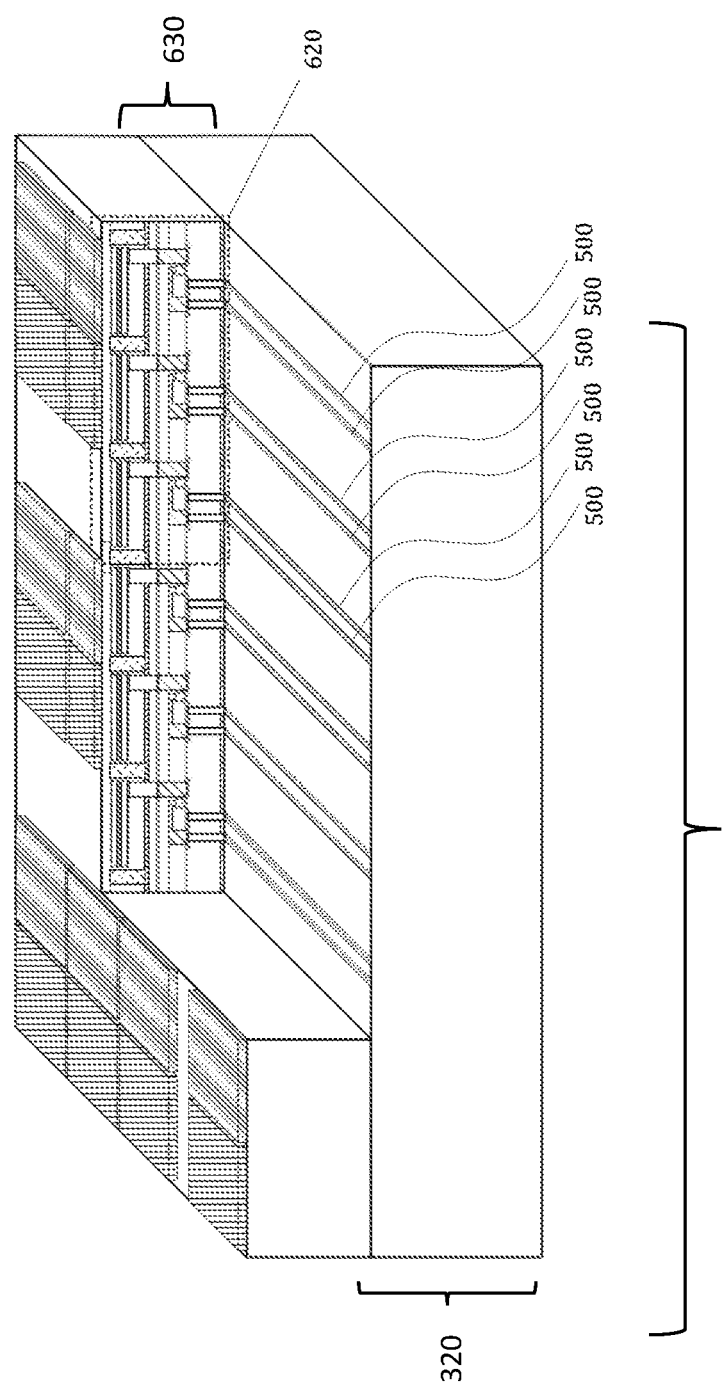
FIG. 12 schematically illustrates an isometric view of a light emitting assembly, or a portion of an assembly, comprising a plurality of light emitting devices with a cutaway section to better illustrate the devices.

FIG. 12 is an isometric schematic of one embodiment an unfinished light emitting assembly 610. For clarity, light emitting assembly 610 is shown without a passivating layer disposed over the wavelength-converting layers, hence the description as unfinished. A cut away section 630 shows a cross section of six light emitting devices. Metal interconnects 500 of backboard 320 are connected electrically to the light emitting devices. For example, assembly 610 may be diced from the larger plurality of light emitting devices, although the finished assembly would have passivating layers (not shown) disposed on the wavelength-converting layers. Dicing of an assembly of light emitting devices may be accomplished by any suitable method, for example by scribing and breaking, mechanical sawing with a dicing saw, or laser cutting. While dicing results in some kerf loss, by dicing an assembly comprising many light emitting devices instead of single light emitting devices, kerf loss per light emitting device is minimized. In a different embodiment (not shown), a light emitting assembly is a pixel comprising three light emitting devices. In other embodiments, a light emitting assembly may comprise, four, six, nine, one hundred, or more, light emitting devices.

If a display has a small size, the display may comprise one assembly of light emitting devices. For example, wrist watch display screens, process indicators, or any small display might be fabricated from one assembly of light emitting devices. It is to be understood that there are many other steps to fabrication of a functional display, and the assembly of light emitting devices comprises one component of the display.

Figure 13A:
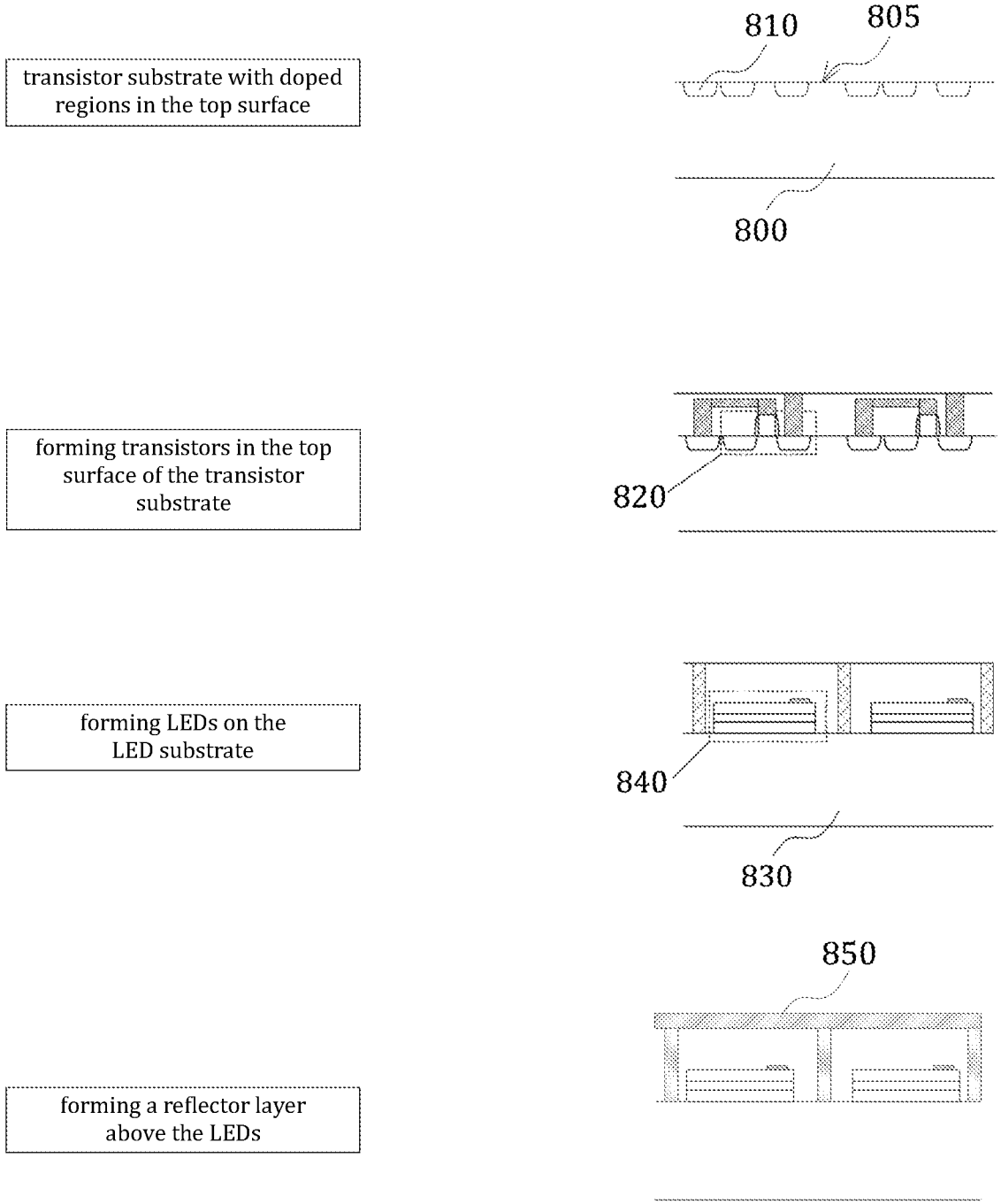
FIGS. 13A, 13B, and 13C schematically illustrate the steps to fabricate an assembly of light emitting devices, with the steps in text on left and schematic illustrations of the assembly in various steps of fabrication on right.
Figure 13B:
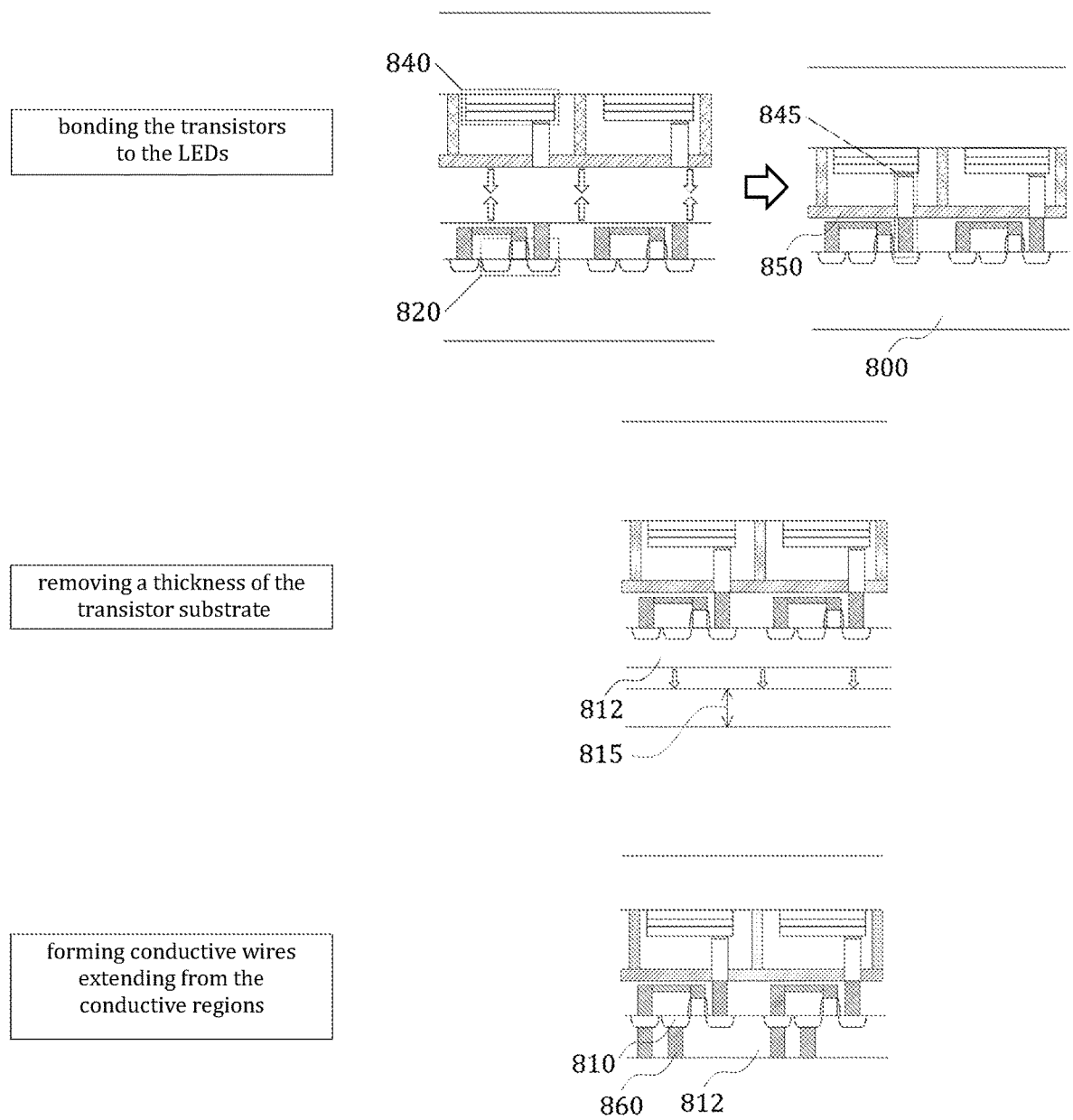
Figure 13C:
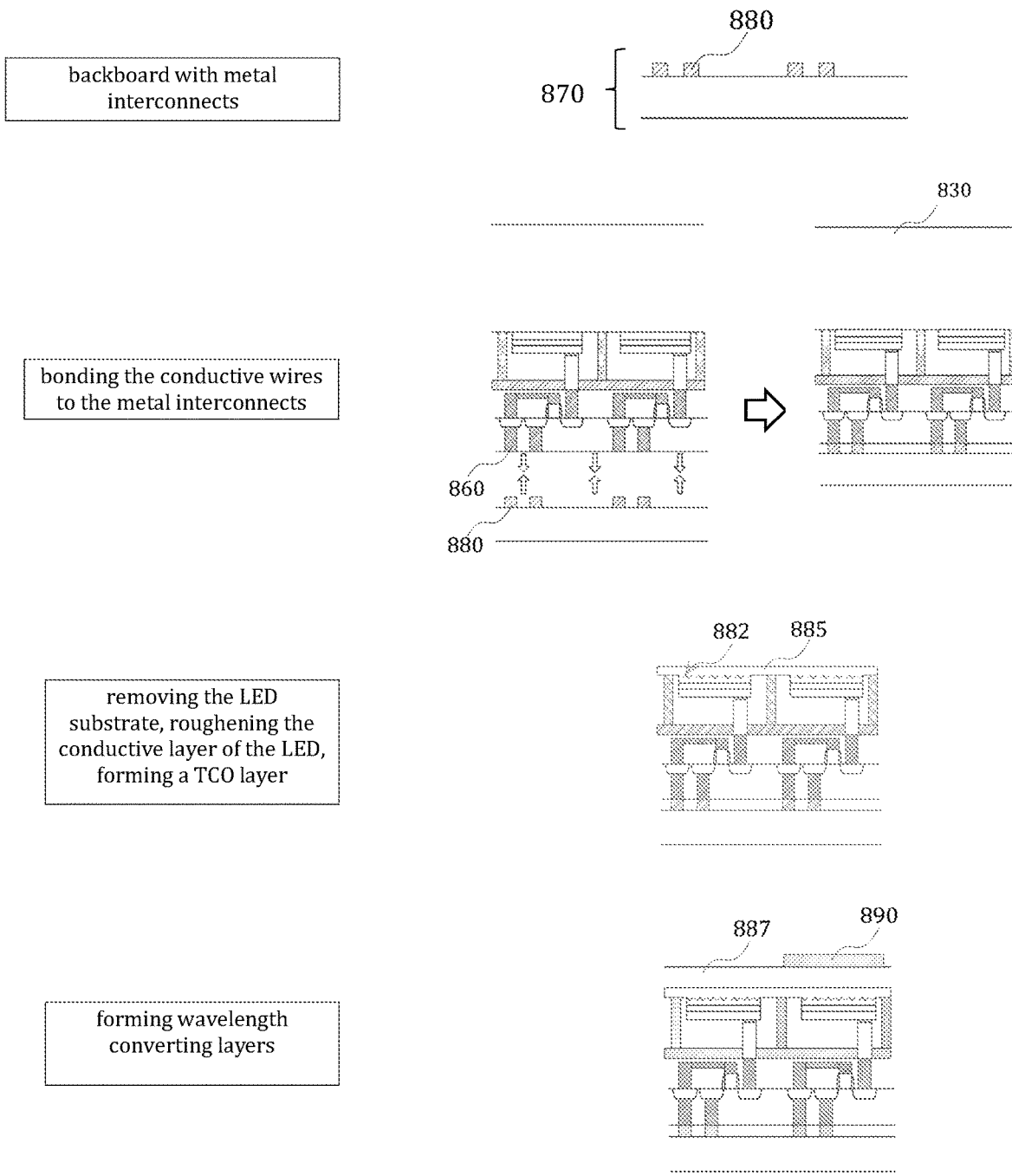

FIGS. 13A through 13C summarize one embodiment of a method to make an assembly of light emitting displays. Two light emitting devices in the assembly are shown in cross section in FIG. 13, but it is to be understood that many more light emitting devices may exist in the assembly. Fabrication of the transistor devices is first described. Transistor substrate 800 having a top surface 805 comprises a plurality of conductive regions 810. The transistor substrate 800 may comprise single crystal silicon and/or an etch-stop layer (not shown). A plurality of transistors is formed in the transistor substrate, one example of which is identified as transistor 820. Next, fabrication of the LED devices is described. A plurality of LEDs, one of which is identified by example as LED 840, is formed on LED substrate 830. Each LED of the plurality has a surface area. Next, at least one reflector layer 850 is formed, wherein the reflector layer or layers at least partially overlie the LEDs.

Next, turning to FIG. 13B, the transistor apparatus are bonded to the LED apparatus. After bonding, each LED is connected electrically to one transistor. As shown in FIG. 13, LED 840 is connected to transistor 820 by interconnect 845. Reflector layer 850 is disposed between an LED and a transistor. Each LED at least partially overlies a transistor. Next, a thickness 815 of the transistor substrate 800 is removed, leaving a different thickness 812 of the transistor substrate. Conductive wires 860 are fabricated in the thinned transistor substrate 812, each extending from a conductive region 810. Next, turning to FIG. 13C, a backboard 870 with metal interconnects 880 is provided. The metal interconnects 880 are bonded to the conductive wires 860. LED substrate 830 is then removed. The surface 882 of a conductive layer of the LEDs may be roughened, and a TCO layer 885 deposited on the surface of the conductive layer of the LEDs. A dielectric layer 887 is disposed on the TCO layer, and wavelength converting layer 890 may be disposed on some of the light emitting devices.

III. Display Apparatus with Multiple Assemblies of Light Emitting Devices

Figure 14:
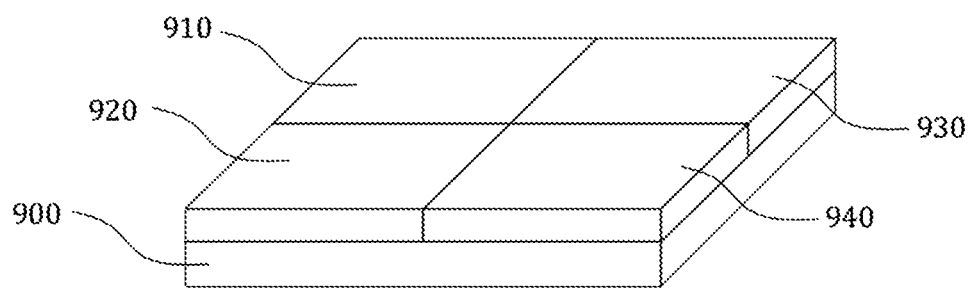
FIG. 14 schematically illustrate a display apparatus with assemblies of light emitting devices.

A display apparatus may comprise a plurality of assemblies of light emitting devices bonded to a backboard. It is to be understood that a functional display apparatus will comprise other components besides the assemblies of light emitting devices. By fabricating a display from multiple assemblies, only functional assemblies that have been tested may be used to ensure the display is functional. FIG. 14 is an isometric schematic of an embodiment of a display apparatus or a portion of a display apparatus with four assemblies 910, 920, 930, and 940 of light emitting devices which are bonded to backboard 900. Each assembly may be diced from a larger assembly. Each assembly of light emitting devices comprises one transistor substrate and one LED substrate. The LED substrate of each assembly is intact before dicing the plurality of transistor+diode apparatus, and then bonding to backboard 900. Backboard 900 comprises a plurality of metal interconnects (not shown), and the transistor+diode apparatus are connected electrically to the metal interconnects. The transistor substrate has a top surface comprising a plurality of conductive regions. Transistors are formed in the top surface. Each assembly has a plurality of conductive wires, wherein each conductive wire extends from a conductive region of the plurality. There is a plurality of LEDs formed on the LED substrate, and each LED is connected electrically to a transistor. There is at least one reflective layer, and the reflective layer is disposed between an LED and a transistor. The LED substrate may be removed after bonding to the backboard. Wavelength-converting layers are disposed over the LEDs, and passivating layers applied. A single backboard 900 is bonded to the assemblies 910, 920, 930, and 940. In this manner, larger displays may be fabricated from multiple assemblies, compared to the single assembly described in section II.

Summarizing, one embodiment of a method to fabricate a display apparatus comprises forming a plurality of assemblies of light emitting devices 910, 920, 930, and 940, as shown in FIG. 14. The fabrication of each assembly of light emitting devices has been described previously in one embodiment, and is summarized in FIG. 13. These assemblies are bonded to backboard 900 which comprises metal interconnects (not shown). After bonding, each metal interconnect is connected electrically to one of the plurality of transistors in each assembly.

It is to be understood that the shape and number of assemblies used to make a display may take any suitable shape and number. For example, one assembly may comprise 3 light emitting devices, and there may be millions of assemblies bonded to one backboard of a display. In other embodiments, one assembly may comprise 3, 300, 3,000, or 3,000,000 or more light emitting devices, and the display may comprise 2, 10, or 1,000,000 or more assemblies.

What is claimed is:

1. A method for forming an assembly of light emitting devices, the method comprising:
   providing a transistor substrate having a top surface and a bottom surface, the top surface comprising a plurality of conductive regions;
   forming a plurality of transistors in the top surface of the transistor substrate;
   providing an LED substrate;
   forming a plurality of LEDs on the LED substrate, each LED of the plurality of LEDs having a surface area and wherein the plurality of LEDs comprises gallium nitride, indium gallium nitride, indium arsenide, aluminum gallium arsenide, gallium arsenide, gallium phosphide, gallium arsenide phosphide, or aluminum indium gallium phosphide;
   forming at least one reflector layer, the at least one reflector layer at least partially overlying an LED of the plurality of LEDs;
   bonding the plurality of transistors to the plurality of LEDs, wherein after bonding the plurality of transistors to the plurality of LEDs,
      the at least one reflector layer is disposed between an LED of the plurality of LEDs and a transistor of the plurality of transistors,
      each LED of the plurality of LEDs is connected electrically to a transistor of the plurality of transistors, and
      each LED of the plurality of LEDs at least partially overlies a transistor of the plurality of transistors;
   removing a thickness of the transistor substrate; and
   forming a plurality of conductive wires, wherein each conductive wire of the plurality extends through the transistor substrate from conductive region of the plurality of conductive regions to the bottom surface of the transistor substrate.

2. The method of claim 1, wherein the transistor substrate comprises single crystal silicon.

3. The method of claim 1, wherein the transistor substrate comprises an etch-stop layer.

4. The method of claim 1, further comprising forming a plurality of interconnects, each interconnect extending from an LED of the plurality of LEDs.

5. The method of claim 1, further comprising providing a plurality of side reflectors, wherein the side reflectors are disposed between LEDs of adjacent light emitting devices of the plurality of light emitting devices and prevent light from adjacent light emitting devices from mutually interfering.

6. The method of claim 1, wherein after the step of removing a thickness of the transistor substrate step, the transistor substrate has a thickness less than 20 microns.

7. The method of claim 1, further comprising providing a backboard, wherein the backboard comprises a plurality of metal interconnects.

8. The method of claim 7, further comprising bonding each conductive wire of the plurality of conductive wires to one of the plurality of metal interconnects.

9. The method of claim 8, further comprising removing the LED substrate.

10. The method of claim 9, further comprising providing a plurality of wavelength-converting layers, wherein each wavelength-converting layer at least partially overlies an LED of the plurality of LEDs.

11. The method of claim 1, wherein the surface area of at least one LED of the plurality of LEDs is 40,000 square microns or less.

12. The method of claim 1, wherein the surface area of at least one LED of the plurality of LEDs is 1,000 square microns or less.

13. The method of claim 1, wherein the surface area of at least one LED of the plurality of LEDs is 100 square microns or less.

* * * * *